United States Patent
Nishita et al.

(10) Patent No.: US 7,839,078 B2
(45) Date of Patent: Nov. 23, 2010

(54) ORGANIC ELECTROLUMINESCENT ELEMENT HAVING A LUMINESCENT LAYER AND A BUFFER LAYER ADJACENT THERETO

(75) Inventors: Nobuhiro Nishita, Kanagawa (JP); Hisashi Okada, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 629 days.

(21) Appl. No.: 11/520,732

(22) Filed: Sep. 14, 2006

(65) Prior Publication Data
US 2007/0057630 A1    Mar. 15, 2007

(30) Foreign Application Priority Data
Sep. 15, 2005    (JP) .............................. 2005-269026

(51) Int. Cl.
*H01J 63/04*    (2006.01)
*H01J 1/62*    (2006.01)
(52) U.S. Cl. ..................... 313/504; 313/483; 313/505; 313/506; 313/503; 428/690; 428/917
(58) Field of Classification Search ....................... None
See application file for complete search history.

(56) References Cited

U.S. PATENT DOCUMENTS

| 7,173,370 | B2 * | 2/2007 | Seo et al. ...................... 313/504 |
| 7,196,360 | B2 * | 3/2007 | Seo et al. ...................... 257/101 |
| 2002/0086180 | A1 * | 7/2002 | Seo et al. ...................... 313/504 |
| 2006/0269784 | A1 * | 11/2006 | Ren et al. ................... 313/506 |
| 2006/0279203 | A1 * | 12/2006 | Forrest et al. ............... 313/504 |

FOREIGN PATENT DOCUMENTS

| JP | 2002-305085 A | 10/2002 |
| JP | 2002-313584 A | 10/2002 |

* cited by examiner

*Primary Examiner*—Nimeshkumar D Patel
*Assistant Examiner*—Natalie K Walford
(74) *Attorney, Agent, or Firm*—Birch, Stewart, Kolasch & Birch, LLP

(57) ABSTRACT

The present invention provides an organic electroluminescent element comprising a plurality of organic compound layers between a pair of electrodes and comprising at least a luminescent layer and a buffer layer adjacent to the luminescent layer, the luminescent layer comprising at least two host materials and at least one luminescent material, the buffer layer comprising at least one of the host materials and at least one dopant material having a charge trapping function.

20 Claims, 1 Drawing Sheet

ORGANIC ELECTROLUMINESCENT ELEMENT HAVING A LUMINESCENT LAYER AND A BUFFER LAYER ADJACENT THERETO

CROSS REFERENCES TO RELATED APPLICATIONS

This invention claims priority under 35 USC 119 from Japanese Patent Application Nos. 2005-269026, the disclosure of which is incorporated by reference herein.

BACKGROUND OF THE INVENTION

1. Field of the Invention

The invention relates to an organic electroluminescent element (may be appropriately referred to as an organic EL element or an element hereinafter) that can be effectively used for surface light sources such as a full color display, a backlight and an illumination light source, and light source arrays of such as printers.

2. Description of the Related Art

The organic EL element comprises a luminescent layer or a plurality of organic compound layer including the luminescent layer, and a pair of opposite electrodes with interposition of the organic compound layer. Electrons injected from a cathode and holes injected from an anode are recombined in the organic compound layer of the organic EL element, and a light is emitted from the element by taking advantage of light emission from excitons formed by recombination, and/or light emission from excitons of other molecules formed by energy transfer from the excitons formed by recombination.

Luminance and element efficiency of organic EL elements have been largely improved by forming a laminated structure having different functions in respective layers. For example, frequently used elements include a dual-layer laminated element having a hole transport layer and a layer that serves as both a luminescent layer and electron transport layer, a three-layer laminated element having a hole transport layer, a luminescent layer and an electron transport layer, and a four-layer laminated element comprising a hole transport layer, a luminescent layer, a hole blocking layer and an electron transport layer (for example, see Science, Vol. 267, No. 3, 1995, p 1332 1).

However, practical application of the organic EL element yet involves many problems to be solved. In particular, the largest problem is deterioration of the quality during continuous driving, or incidence and growth of non-luminescent or low luminance regions (so-called dark spots).

A method proposed for preventing deterioration of luminance during driving is to eliminate interfaces of the organic layer in the element by providing a mixed region of a hole transport material and an electron transport material (see, for example, Japanese Patent Application Laid-Open (JP-A) No. 2002-305085). Deterioration of luminance is prevented by this method by suppressing electric charges from accumulating at the interface during driving by eliminating the interface between the organic layers in the element. However, the holes leaking out of the mixed region may be injected into the electron transport material, or the electrons leaking out of the mixed region may be injected into the hole transport material at the interface of the region adjacent to the mixed region. Accordingly, it may be apprehended that deterioration of the hole transport material from an anionic state or deterioration of the electron transport material from a cationic state may be caused.

In another proposed method, a region for forming a concentration gradient is provided between a carrier transport region consisting of only the electron transport material and the mixed region (see, for example, JP-A No. 2002-313584). However, the charge leaking out of the mixed region recombines in the concentration gradient region, and luminous efficiency may be decreased or the charge transport material may show deterioration from the excited state.

SUMMARY OF THE INVENTION

The invention has been made in view of the above circumstances and provides an organic electroluminescent element.

A first aspect of the invention provides an organic electroluminescent element comprising a plurality of organic compound layers between a pair of electrodes and comprising at least a luminescent layer and a buffer layer adjacent to the luminescent layer, the luminescent layer comprising at least two host materials and at least one luminescent material, the buffer layer comprising at least one of the host materials and at least one dopant material having a charge trapping function.

BRIEF DESCRIPTION OF THE DRAWINGS

The present invention will become more fully understood from the detailed description given hereinbelow and the accompanying drawing. The drawing is not to scale, and is given by way of illustration only. Accordingly, the drawing should not be construed as limiting the present invention.

DETAILED DESCRIPTION OF THE INVENTION

Figure 1:
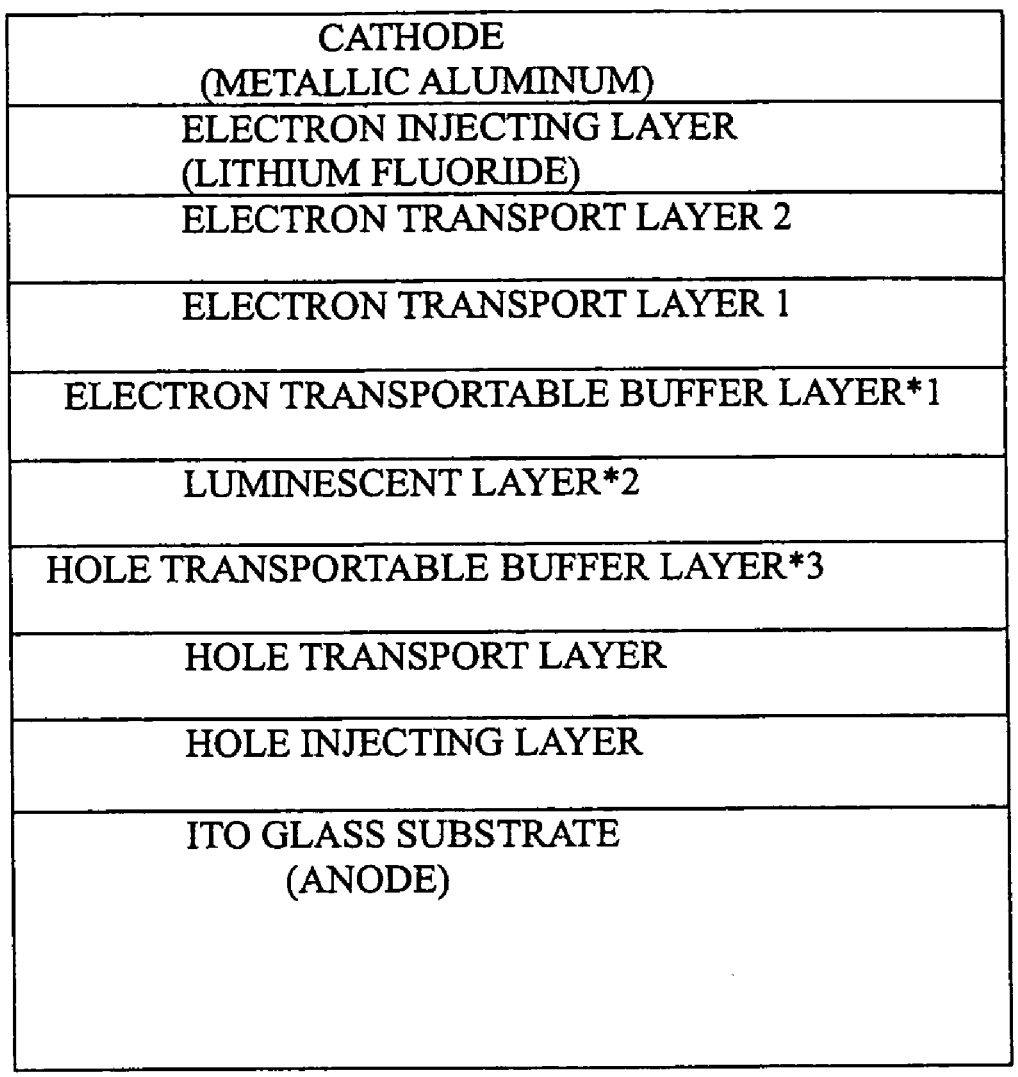
FIG. 1 is an illustration of an organic electroluminescent element in accordance with one embodiment of the present invention.

The inventors of the invention have completed the invention by finding, through intensive studies, that the above-mentioned problem can be solved by an organic electroluminescent element having a luminescent layer containing at least two host materials and a buffer layer adjoining to the luminescent layer, wherein the buffer layer contains at least one host material contained in the luminescent layer and a dopant material having a charge trapping function.

The organic EL element of the invention comprises a plurality of organic compound layers containing at least a luminescent layer between a pair of electrodes and a buffer layer adjacent to the luminescent layer. The luminescent layer contains at least two host materials and at least one luminescent material, and the buffer layer contains at least one host material described above and at least one dopant material having charge trapping function (may be simply referred to as a "dopant material").

While the reason for improving running durability has not been made clear yet in the organic EL element of the invention, it may be elucidated as follows.

While most of electrons and holes injected into the luminescent layer contribute to emission of light by being recombined in the luminescent layer in the organic EL element having a mixed region of an electron transport material and a hole transport material as described in JP-A No. 2002-305085, it is thought that a part of electrons and holes leak to an adjacent layer opposite to the injected side. Then, the electrons leaked to the anode side form an anionic state by being injected into the hole transport material, while the holes leaked to the cathode side forms a cationic state by being injected into the electron transport material. It may be conjectured that the driving voltage of the element increases and luminous efficiency of the element decreases, in the element described in the patent publication cited above, by deterioration of the hole transport material from the anionic state thus formed and by deterioration of the electron transport material from the cationic state thus formed.

On the contrary, the dopant material is supposed to trap the electrons or holes leaked out of the luminescent layer in the organic EL element of the invention, as the buffer layer adjacent to the luminescent layer contains the dopant material. Consequently, the hole transport material contained at the anode side of the luminescent layer is effectively prevented from being in the anionic state, and/or the electron transport material contained at the cathode side of the luminescent layer is prevented from being in the cationic state, thereby enabling running durability of the element to be improved. Furthermore, the material having a charge trapping function can emit a light by trapping and recombining leaked charges when the material having the charge trapping function is used as the luminescent material. Therefore, luminous efficiency may be suppressed from being decreased by leakage of the charge.

The cause of exhibiting an effect of decreasing driving voltage is supposed as follows in the organic EL element of the invention. That is, when the buffer layer adjacent to the luminescent layer contains at least one of two or more host materials contained in the luminescent layer, the height of the barrier for injecting the charge from the adjacent layer to the luminescent layer is lowered to thereby enable the driving voltage of the element to be reduced.

The construction of the organic EL element of the invention will be described in detail.

The organic EL element of the invention has a plurality of organic compound layers containing at least a luminescent layer and a buffer layer adjacent to the luminescent layer between a pair of electrodes (anode and cathode). The element preferably has a charge transport layer between the anode and luminescent layer, specifically a hole transport layer between the anode and luminescent layer, and/or an electron transport layer between the cathode and luminescent layer.

The charge transport layer of the invention is preferably a layer containing a charge transport material not contained in the luminescent layer from the viewpoint of optimizing control of charge injection from the electrode and transportability of the charge.

For the make up of the organic EL element at least one of the pair of electrodes is preferably transparent when the nature of is considered.

The luminescent layer should contain two or more of host materials and at least one luminescent material. Two or more of the host materials preferably comprise a hole transportable host material and an electron transportable host material.

The buffer layer contains at least one of two or more of the host materials contained in the luminescent layer and a dopant material having a charge trapping function, and has at least a function for receiving the charge from the charge transport layer to inject the charge into the luminescent layer and a function for trapping the charge leaked out of the luminescent layer. Preferably, the buffer layer is formed as a hole transportable buffer layer when the layer is formed at the anode side of the luminescent layer, or as an electron transportable layer when the layer is formed at the cathode side of the luminescent layer.

Details of each element constituting the organic EL element such as the electrode, luminescent layer and buffer layer will be described in detail later.

In a preferable aspect of the invention, the organic compound layer is formed by laminating the hole transport layer, luminescent layer and electron transport layer in this order from the anode side. It is also preferable that the hole transportable buffer layer is formed between the hole transport layer and luminescent layer, and/or the electron transportable buffer layer is formed between the luminescent layer and electron transport layer. A hole-injecting layer may be provided between the anode and hole transport layer, and an electron-injecting layer may be provided between the cathode and electron transport layer.

Although the layer comprises at least one of the layer structures of (1) to (3) below in a favorable aspect of the organic compound layer in the organic electroluminescent element of the invention, the layer structure is not restricted thereto:

(1) a structure comprising the hole-injecting layer, hole transport layer (or one layer may serve as both the hole-injecting layer and hole transport layer), hole transportable buffer layer, luminescent layer, electron transport layer and electron-injecting layer (or one layer may serve as both the electron transport layer and electron-injecting layer);

(2) a structure comprising the hole-injecting layer, hole transport layer (or one layer may serve as both the hole-injecting layer and hole transport layer), luminescent layer, electron transportable buffer layer, electron transport layer and electron-injecting layer (or one layer may serve as both the electron transport layer and electron-injecting layer); and (3) a structure comprising the hole-injecting layer, hole transport layer (or one layer may serve as both the hole-injecting layer and hole transport layer), hole transportable buffer layer, luminescent layer, electron transportable buffer layer, electron transport layer and electron-injecting layer (or one layer may serve as both the electron transport layer and electron-injecting layer).

FIG. 1 shows one embodiment of the organic electroluminescent element of the present invention. In one embodiment, the organic electroluminescent element comprises an ITO glass substrate (anode), hole injecting layer, hole transport layer, hole transportable buffer layer 3, a luminescent layer 2, an electron transportable buffer layer 1, electron transport layers 1 and 2, an electron injecting layer and a cathode. In FIG. 1, the electron transportable buffer layer 1 comprises an electron transportable host (ETM-1) and a phosphorescent dopant (EM-1). The luminescent layer 2 comprises a hole transportable host (CBP), an electron transportable host (ETM-1) and a phosphorescent dopant (EM-1). The hole transportable buffer layer 3 comprises a hole transportable host (CBP) and a phosphorescent dopant (EM-1).

The element constituting the luminescent element of the invention will be described in detail hereinafter.

<Organic Compound Layer>

The organic compound layer of the invention will be described below.

The organic compound layer of the invention contains at least the luminescent layer and buffer layer (hole transportable buffer layer and/or electron transportable buffer layer) adjacent to the luminescent layer, and examples of the organic compound layer except the luminescent layer include the hole-injecting layer, hole transport layer, hole transportable buffer layer, electron transportable buffer layer, electron transport layer and electron-injecting layer.

Each layer may be divided into plural secondary layers.

—Forming the Organic Compound Layer—

Each layer constituting the organic compound layer in the organic EL element of the invention may be favorably formed by any one of a dry film deposition method such as a vacuum deposition method and sputtering method, transfer method, printing method, coating method, ink jet method and spray method.

(Buffer Layer)

While the buffer layer of the invention is a layer having at least a function for receiving the charge from the charge transport layer to inject the charge into the luminescent layer and a function for trapping the electrons leaked out of the luminescent layer, the layer may have other functions together.

The buffer layer is required to contain at least one of two or more of the host materials contained in the luminescent layer, and at least one of the dopant materials having charge trapping functions.

The buffer layer is preferably formed as the hole transportable buffer layer when the buffer layer is formed in adjoining relation to the anode side of the luminescent layer. The hole transportable layer preferably contains at least one of the hole transportable host materials contained in the luminescent layer. The hole transportable buffer layer preferably has a function for enhancing hole injection into the luminescent layer, and/or a function for blocking the electrons.

The buffer layer is preferably formed as an electron transportable buffer layer when the buffer layer is formed in adjoining relation to the cathode side of the luminescent layer. The electron transportable buffer layer preferably contains at least one of the electron transportable host materials contained in the luminescent layer. The electron transportable buffer layer preferably has a function for enhancing injection of electrons into the luminescent layer, and/or a function for blocking the holes.

It is also preferable that the hole transportable buffer layer and/or electron transportable buffer layer has a function for blocking excitons formed in the luminescent layer.

The buffer layer may be divided into plural secondary layers.

A hole transportable host or an electron transportable host, which are described as the host materials contained in the luminescent layer below, may be favorably used as the host material contained in the buffer layer.

The buffer layer is required to contain at least one of the dopant materials having an electron trapping function.

The dopant material having the charge trapping function in the invention has a lower ionization potential than the ionization potential of the host material when the function is to trap the holes, while the dopant material having the electron trapping function has a higher electron affinity than the electron affinity of the host material when the function is to trap the electrons.

The dopant material of the invention preferably has the hole trapping function or electron trapping function, or both functions.

The hole transportable buffer layer preferably contains at least one of dopant materials having the electron trapping function. The electron transportable buffer layer preferably contains at least one of dopant materials having the hole trapping function.

The buffer layer may contain two or more of the dopant materials.

Specific examples of the dopant material contained in the buffer layer favorably include arylamine materials, thiophene derivatives, fluorescent dopant materials that are described later, phosphorescent dopant materials, and metal complex materials containing Ir complex, Pt complex, Cu complex, Re complex, W complex, Rh complex, Ru complex, Pd complex, Os complex, Eu complex, Tb complex, Gd complex, Dy complex and Ce complex.

The dopant material of the invention is preferably a luminescent material among the materials described above from the viewpoint of further improvement of luminous efficiency.

The luminescent material favorably used as the dopant material is a luminescent dopant described below as a luminescent material contained in the luminescent layer.

The content ratio of the dopant material in the buffer layer is preferably from 0.1 to 30% by mass, more preferably from 1 to 15% by mass, and particularly from 2 to 12% by mass relative to the total amount of the compounds usually forming the buffer layer.

The content ratio of the dopant material relative to the amount of the host material contained in the buffer layer is preferably from 0.1 to 40% by mass, more preferably from 1 to 20% by mass, and further preferably from 2 to 15% by mass.

The thickness of the buffer layer is preferably from 0.1 nm or more to 20 nm or less, more preferably from 0.5 nm or more to 15 nm or less, and particularly from 1 nm or more to 10 nm or less from the viewpoint of decreasing the driving voltage, improving the luminous efficiency and improving durability.

In a favorable aspect of the invention, the buffer layer contains one host material and one dopant material (the buffer layer of this aspect is referred to as "buffer layer (A)").

When buffer layer (A) is a hole transportable buffer layer, the buffer layer preferably contains one hole transportable host and one dopant material. When the buffer layer is an electron transportable buffer layer, on the other hand, the buffer layer preferably contains one electron transportable host and one dopant material.

The charge leaking out of the luminescent layer to the buffer layer can be trapped with the dopant material by forming the buffer layer of the invention with buffer layer (A). This enables the host material in the buffer layer to be effectively prevented from being deteriorated by the charge to thereby enable durability of the element against driving to be improved.

In another favorable aspect of the invention, the buffer layer contains two host materials including host material A and host material B, wherein the content ratio of host material A in the buffer layer gradually increases until the ratio of host material A to host material B is x:y (x and y denote positive integers) in the direction of thickness of the buffer layer from electrode side to the luminescent layer side (the buffer layer of this aspect is referred to as "buffer layer (B)" hereinafter).

Leak charge from the luminescent layer can be promptly trapped without accumulating the charge at the interface between the luminescent layer and buffer layer, by forming the buffer layer of the invention as buffer layer (B). In addition, when an injection barrier for the electrons exists at the interface between the luminescent layer and hole transportable buffer layer, the electrons are accumulated at the interface between the luminescent layer and hole transportable buffer layer, and it is quite likely to accelerate deterioration of the host material in the hole transportable buffer layer. When an injection barrier for the holes exists at the interface between the luminescent layer and electron transportable buffer layer, on the other hand, the holes are accumulated at the interface between the luminescent layer and electron transportable buffer layer, and it is quite likely to accelerate deterioration of the host material in the electron transportable buffer layer. The leak charge in the buffer layer is more effectively trapped in this aspect by lowering the barrier for injecting the charge at the interface between the luminescent layer and buffer layer.

An example of buffer layer (B) is (1) a buffer layer containing the electron transportable host material as host material A and the hole transportable host material as host material B, or (2) a buffer layer containing the hole transportable host material as host material A and the electron transportable host material as host material B. While buffer layer (B) may comprise any one of buffer layers (1) and (2), or both buffer layers (1) and (2), it is more preferable that the buffer layer contain both buffer layers (1) and (2).

When buffer layer (B) comprises buffer layer (1), it is preferably formed at the anode side of the luminescent layer, while buffer layer (B) is preferably formed at the cathode side of the luminescent layer when buffer layer (B) comprises buffer layer (2).

The phrase "the content ratio of host material A gradually increases" means that the content ratio of the host material A relative to the host material B increases in the direction of thickness of the buffer layer from the electrode side to the luminescent layer side. While this increment may follow a linear function, or a stepwise function, it is preferable to follow the linear function.

The content ratio of the host material A to the host material B in buffer layer (B) is represented by x:y (x and y are positive integers) at the side nearest to the luminescent layer of buffer layer (B). While x and y may be arbitrarily determined, the ratio of the host material A to the host material B is preferably 1:1.

The content ratio of the host material A to the host material B at the most electrode side of buffer layer (B) may be 0:1, or the host material A may be contained with a smaller content ratio than the host material B.

The dopant material in the buffer layer (B) may be uniformly distributed throughout buffer layer (B), or may be unevenly distributed in buffer layer (B). When the dopant material is unevenly distributed in buffer layer (B), the content of the dopant material gradually increases, for example, in the direction of thickness of the buffer layer from the electrode side to the luminescent layer side according to the increase of the content of the host material A.

While the content ratio of the host material A in the buffer layer (B) gradually increases in the direction of thickness of the buffer layer from the electrode side to the luminescent layer side, the content is constant in the lateral direction without any changes.

While buffer layer (B) is formed, for example, as follows, the method for forming buffer layer (B) is not restricted thereto.

The method for forming the buffer layer by the vacuum deposition method will be then described. When buffer layer (B) is formed at a lower side of the luminescent layer, deposition of host material B starts at a given deposition rate, and the deposition rate of host material A is gradually increased while the deposition rate of buffer layer B is kept constant. The deposition rate of host material A is adjusted so that the content ratio of the host material A to the host material B is represented by x:y when the thickness of the buffer layer has reached a desired thickness.

When the buffer layer is formed as at a upper side of the luminescent layer, deposition of the host materials starts by adjusting the deposition rates of the respective host materials so that the content ratio of the host material A to the host material B is represented by x:y, and the deposition rate of the host material A is gradually decreased while the deposition rate of the host material B is kept constant. When the thickness of the buffer layer has arrived at a desired thickness, the deposition rate of host material A is adjusted so that the content ratio of the host material A to the host material B is 0:1, or so that the content ratio of the host material A is smaller than that of the host material B.

(Luminescent Layer)

The luminescent layer is a layer having a function, when an electric field is applied, for receiving the holes from the anode, hole-injecting layer, hole transport layer or hole transportable buffer layer, and for receiving the electrons from the cathode, electron-injecting layer, electron transport layer or electron transportable buffer layer to permit a light to be emitted by providing a recombination field of the holes and electrons.

The luminescent layer of the invention comprises two or more host materials and at least one luminescent material (appropriately referred to as "luminous dopant" hereinafter).

The luminescent layer may comprise one layer or two or more layers, and each layer may emit a different light. Each layer of the luminescent layer preferably contains two or more host compounds and at least one luminescent dopant even when the luminescent layer comprises plural layers.

Two or more of the host compounds and at least one luminescent dopant contained in the luminescent layer of the invention may be a combination of a fluorescent dopant that emits light (fluorescent light) from a singlet state and two or more of the host materials, or may be a combination of a phosphorescent dopant that emits light (phosphorescent light) from a triplet state and two or more of the host materials. However, the combination of the phosphorescent dopant and two or more of the host materials is preferable from the viewpoint of luminous efficiency.

The luminescent layer of the invention may contain two or more of the luminescent dopants for improving color purity and for expanding light-emitting wavelength region.

—Luminescent Dopant—

Either phosphorescent materials or fluorescent materials may be used as the luminescent dopant of the invention. However, the luminescent material (luminescent dopant) contained in the luminescent layer is preferably the phosphorescent material (also referred to as "phosphorescent dopant" hereinafter).

=Phosphorescent Dopant=

Examples of the phosphorescent dopant usually include complexes containing transition metal atoms or lanthanide atoms.

While the transition metal atoms are not particularly restricted, preferable examples thereof include ruthenium, rhodium, palladium, tungsten, rhenium, osmium, iridium, gold, silver, copper and platinum, more preferably rhenium, iridium and platinum, and further preferably iridium and platinum.

Examples of the lanthanide atoms include lanthanum, cerium, praseodymium, neodymium, samarium, europium, gadolinium, terbium, dysprosium, holmium, erbium, thulium, ytterbium and lutetium. Neodymium, europium and gadolinium are preferable among these lanthanoid atoms.

Examples of ligands of complexes include those described by G Wilkinson et al, Comprehensive Coordination Chemistry, Pergamon Press, 1987; H. Yersin, Photochemistry and Photophysics of Coordination Compounds, Springer-Verlag, 1987; and Akio Yamamoto, Organometallic Chemistry—Basis and Applications, Shokabo, 1982.

Specific examples of the ligand include halogen ligands (preferably chlorine ligands), aromatic carbon ring ligands (having preferably a carbon number of 5 to 30, more preferably a carbon number of 6 to 30, further preferably a number of 6 to 20 with a carbon number of 6 to 12 particularly preferred, for example, cyclopentadienyl anion, benzene anion, naphthyl anion), nitrogen-containing heterocyclic ligands (having preferably a carbon number of 5 to 30, more preferably a carbon number of 6 to 30, further preferably a number of 6 to 20 with a carbon number of 6 to 12 particularly preferred, for example, phenylpyridine, benzoquinoline, quinolinol, bipyridyl and phenanthroline), diketone ligands (for example acetylacetone), carboxylic acid ligands (having preferably a carbon number of 2 to 30, more preferably a carbon number of 2 to 20, further preferably a number of 2 to 16, for example, acetic acid ligands), alcoholate ligands (having preferably a carbon number of 1 to 30, more preferably a carbon number of 1 to 20, further preferably a number of 6 to 20, for example, phenolate ligands), silyloxy ligands (having preferably a carbon number of 3 to 40, more preferably a carbon number of 1 to 30, further preferably a number of 3 to 20, for example, trimethyl silyloxy ligands, dimethyl-tert-buthylsilyloxy ligands, triphenyl silyloxy ligands) carbon monoxide ligands, isonitrile ligands, cyano ligands, phosphorus ligands (for example, triphenylphosphine ligands), thiolate ligands (for example, phenylthiolate) and phosphineoxide ligands (for example, triphenylphosphineoxide). The nitrogen-containing heterocyclic ligands are more preferable.

The complex may have one transition metal atom in the compound, or may be a so-called multi-nuclear complex having two or more transition metal atoms, or may simultaneously contain different kinds of metal atoms.

Specific examples of luminescent dopants include phosphorescent compounds described in U.S. Pat. Nos. 6,303, 238B1 and 6,097,147; International Publication Nos. 00/57676, 00/70655, 01/08230, 01/39234A2, 01/41512A1, 02/02714A2, 02/15645A1 and 02/44189A1; JP-A Nos. 2001-247859, 2002-302671, 2003-133074, 2003-123982, 2002-117978, 2002-235076, 2002-170684, 2002-226495, 2002-234894, 2001-247859, 2001-298470, 2002-173674, 2002-203678 and 2002-203679 and 2005-310733; Japanese Patent Application Nos. 2001-248165, 2005-75340 and 2005-75341; and European Patent Application No. 1211257.

Examples of further preferable luminescent dopants include complexes of I r, Pt, Cu, Re, W, Rh, Ru, Pd, Os, Eu, Tb, Gd, Dy and Ce. Ir, Pt and Re complexes are particularly preferable, and Ir, Pt and Re complexes having at least one coordination mode such as metal-carbon bonds, metal-nitrogen bonds, metal-oxygen bonds and metal sulfur bonds are preferable among them.

=Fluorescent Dopant=

Examples of the fluorescent dopant include benzooxazole, benzoimidazaole, benzothiazole, styrylbenzene, polyphenyl, diphenyl butadiene, tetraphenyl butadiene, naphthalimide, coumalin, pyran, perynone, oxadiazole, aldazine, pyralidine, cyclopentadiene, bisstyryl anthracene, quinacridone, pyrrolepyridine, thiadiazolopyridine, cyclopentadiene, styrylamine, aromatic dimethylidene compounds, condensed polycyclic aromatic compounds (such as anthracene, phenanthroline, pyrene, perylene, rubrene and pentacene), various metal complexes represented by metal complexes of 8-quinolinol, pyrromethene complexes and rare earth complexes, polythiophene, polymer compounds such as polyphenylene and polyphenylene vinylene and organic silane, and derivatives thereof.

While specific examples of the luminescent dopant include compounds D-1 to D25 described below, they are not restricted thereto.

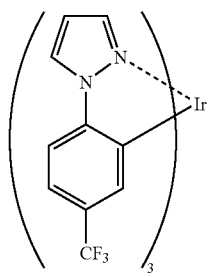

D-1

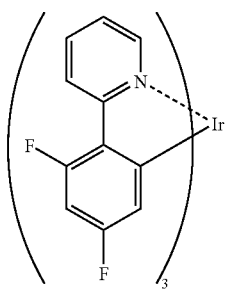

D-2

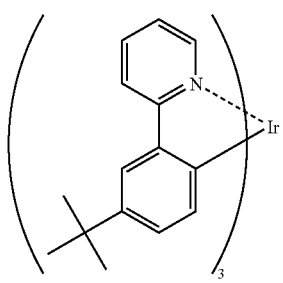

D-3

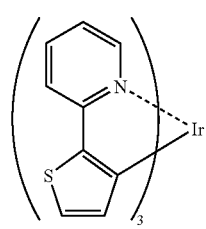

D-4

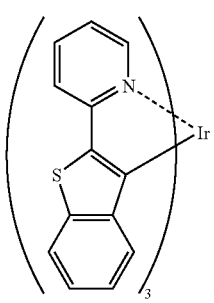

D-5

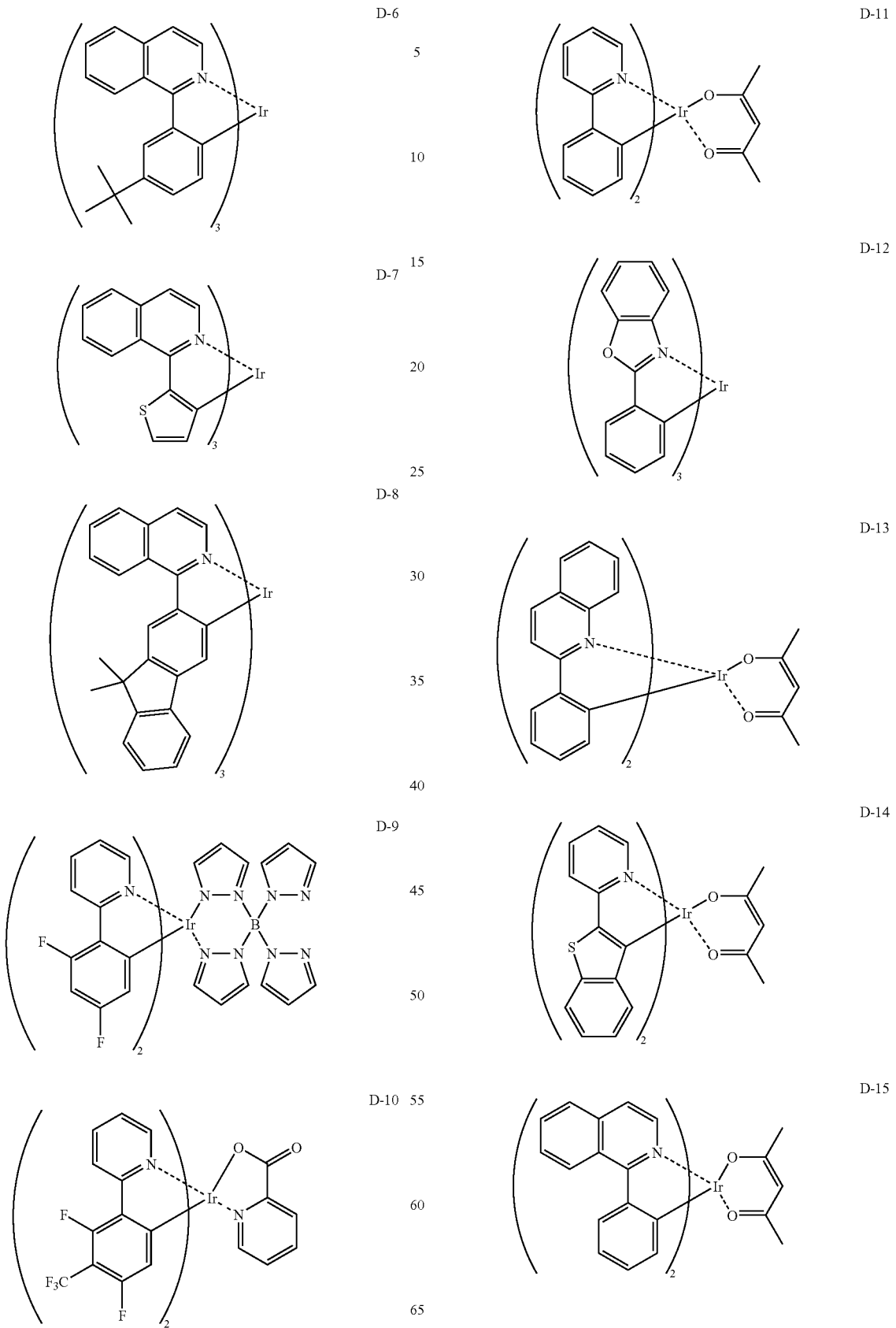

-continued

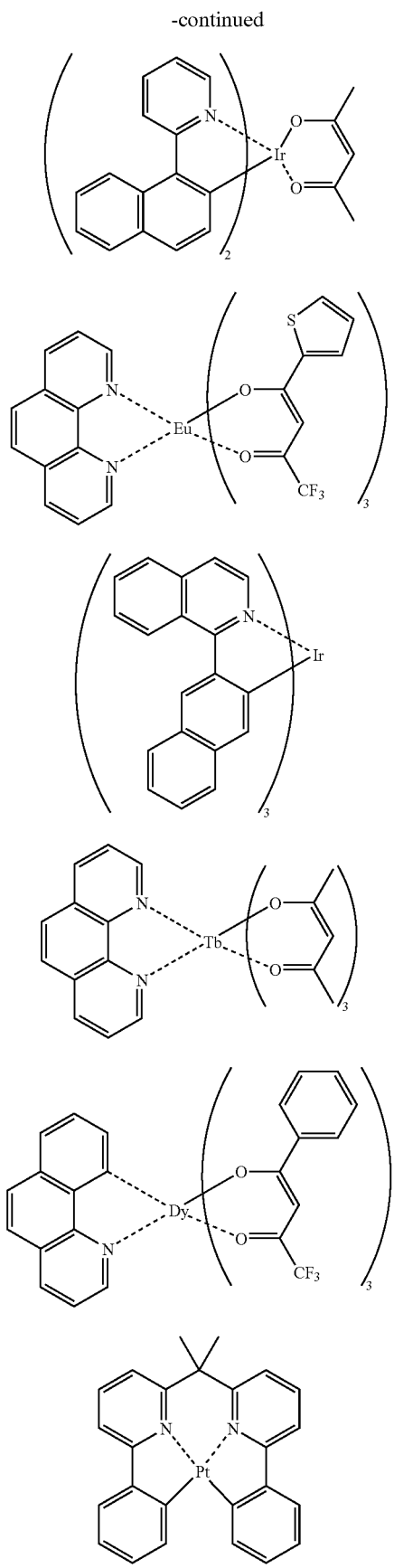

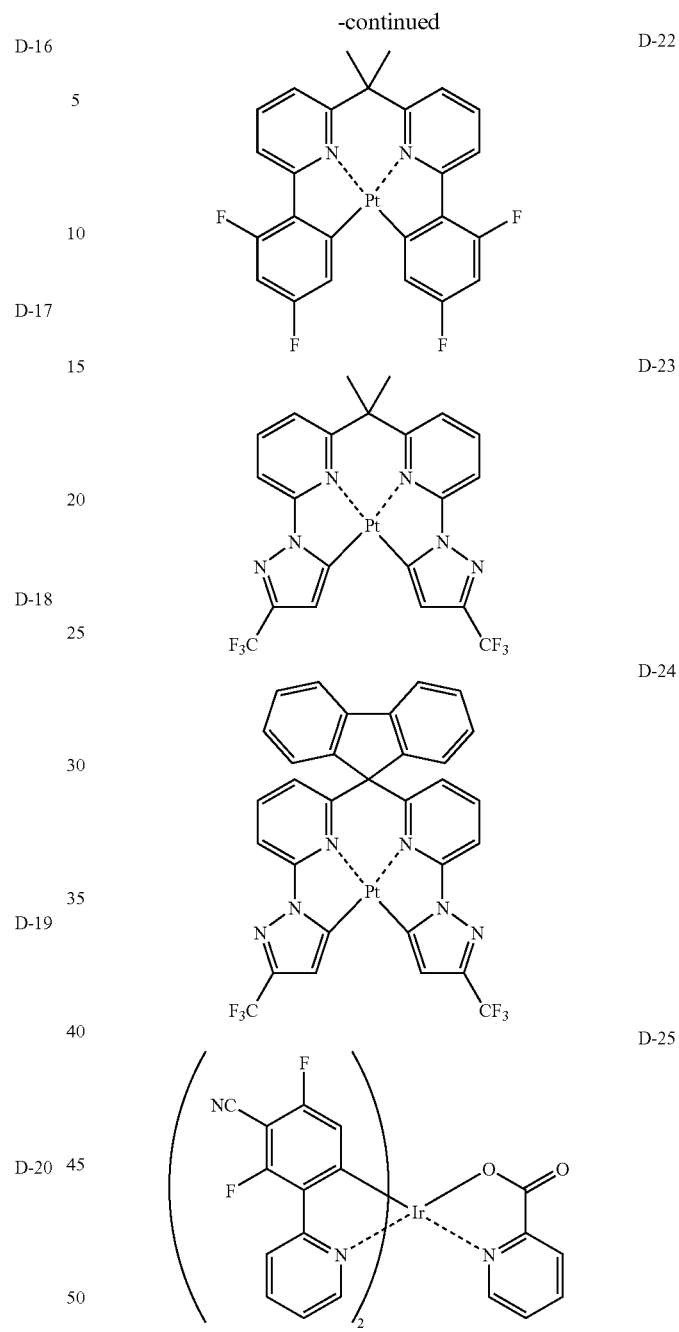

Preferable luminescent dopants used in the invention are D-2, D-3, D-4, D-5, D-6, D-7, D-8, D-9, D-10, D-11, D-12, D-13, D-14, D-15, D-16, D-21, D-21, D-22, D-23, D-24 and D-25 among those described above from the viewpoint of luminous efficiency and durability. D-2, D-3, D-4, D-5, D-6, D-7, D-8, D-12, D-14, D-15, D-16, D-21, D-22, D23 and D-24 are more preferable, and D-21, D-22, D23 and D-24 are further preferable.

While the luminescent dopant is usually contained in the luminescent layer in a proportion from 0.1 to 30% by mass relative to the total amount of the substance that forms the luminescent layer, the content is preferably from 1 to 15% by mass, more preferably from 2 to 12% by mass, from the viewpoint of durability and luminous efficiency.

While the thickness of the luminescent layer is not particularly restricted, it is preferably from 1 nm to 500 nm, more preferably from 5 nm to 200 nm from the viewpoint of luminous efficiency, and further preferably from 5 nm to 100 nm.

—Host Material—

Two or more of the host materials should be used in the luminescent layer. Two or more host materials available are a hole transportable host material (hole transportable host) excellent in transportability of holes, and an electron transportable host material (electron transportable host) excellent in transportability of electron.

=Hole Transportable Host=

The hole transportable host in the luminescent layer used in the invention preferably has an ionization potential IP from 5.1 eV or more to 6.3 eV or less, more preferably from 5.4 eV pr more to 6.1 eV or less, and further preferably from 5.6 eV or more to 5.8 eV or less from the viewpoint of improving durability and reducing the driving voltage. Electron affinity Ea is preferably from 1.2 eV or more to 3.1 eV or less, more preferably from 1.4 eV or more to 3.0 eV or less, and further preferably from 1.8 eV or more to 2.8 eV or less from the viewpoint of improving durability and reducing the driving voltage.

Specific examples of such hole transportable host are as follows.

They are pyrrole, carbazole, triazole, oxazole, oxadiazole, pyrazole, imidazole, polyaryl alkane, pyrazoline, pyrazolone, phenylenediamine, aryl amine, amino-substituted chalcone, styryl anthracene, fuluorenone, hydrazone, stilbene, silazane, aromatic tertiary amine compounds, styrylamine compounds, aromatic dimethylidene compounds, porphyrin compounds, polysilane compounds, oligomers of conductive polymers such as poly(N-vinylcarbazole), aniline polymers, thiophene oligomers and polythiophene, organic silane and carbon film, and derivatives thereof.

Carbazole derivatives, aromatic tertiary amine compounds and thiophene derivatives are preferable among them, and compounds having a plurality of carbazole frames and/or aromatic tertiary amine frames in the molecule are particularly preferable.

While specific examples of the hole transportable host include the compounds listed below (H-1 to H-38), they are not restricted thereto.

H-1
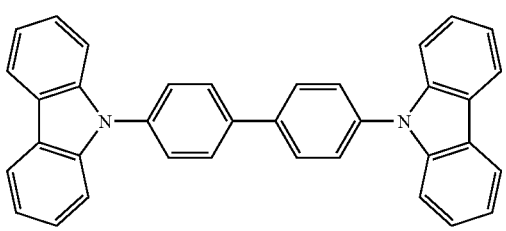

H-2
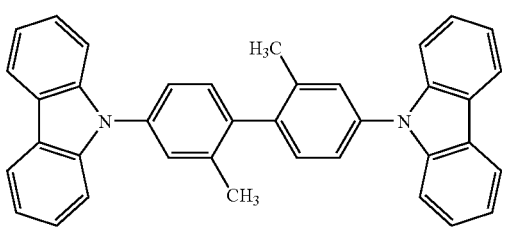

-continued

H-3
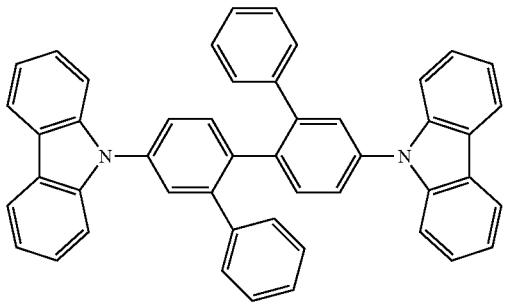

H-4
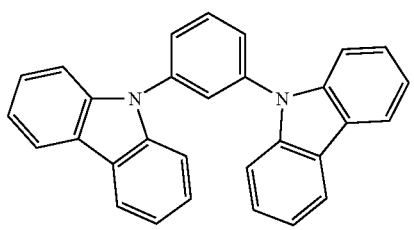

H-5
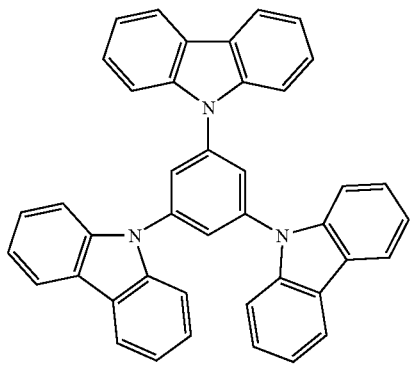

H-6
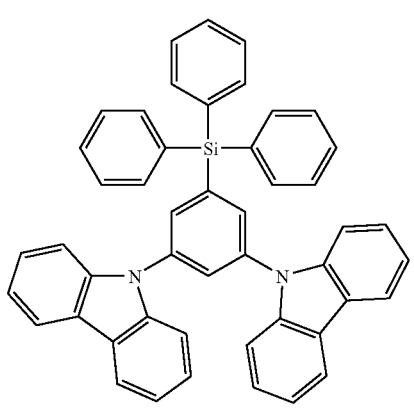

-continued
H-7
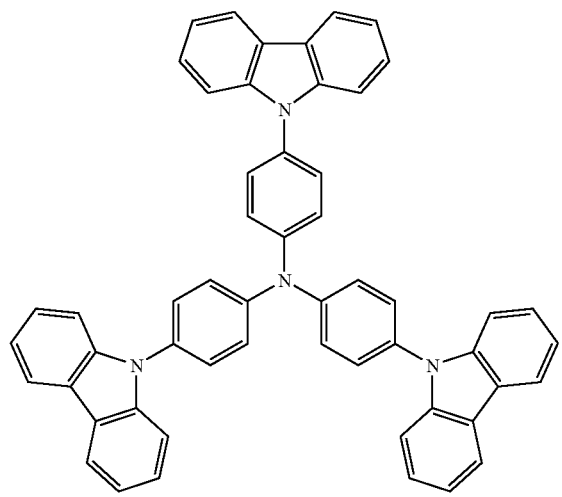
H-8
H-9
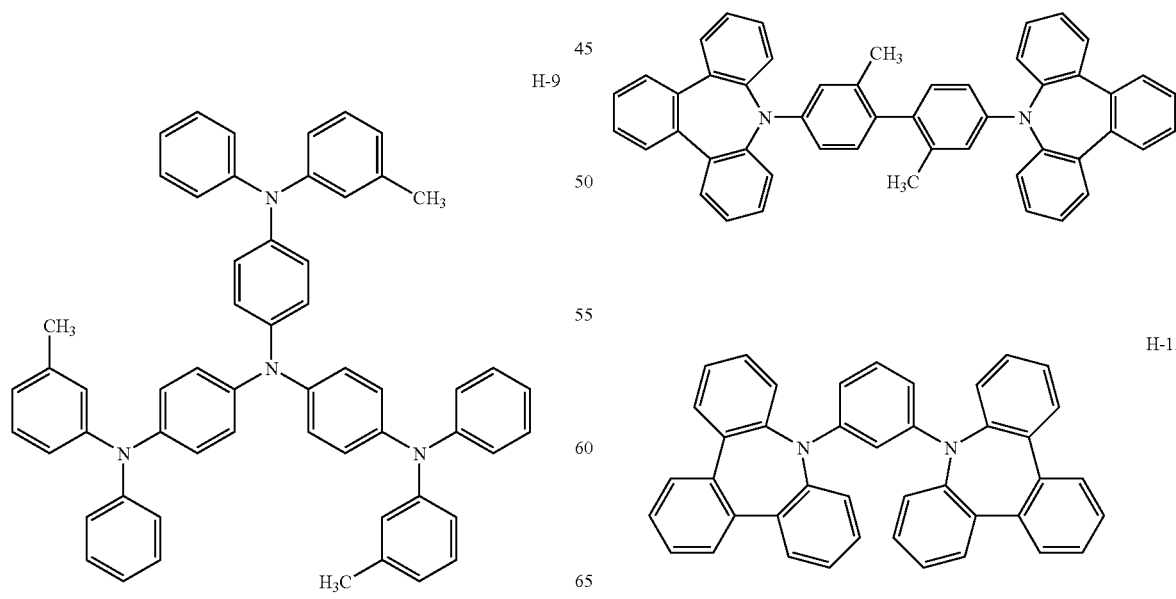
H-10
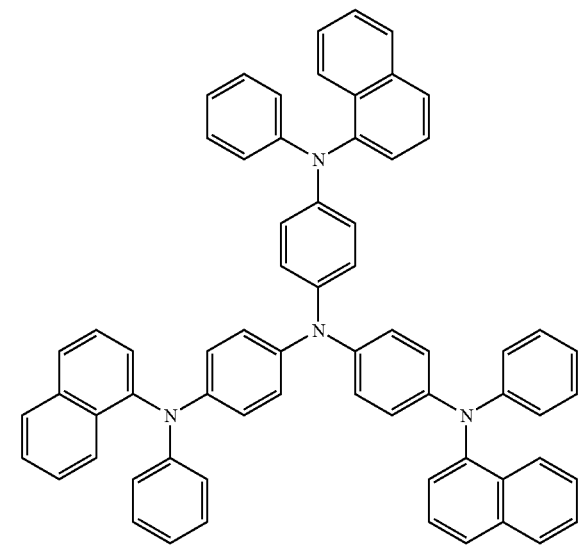
H-11
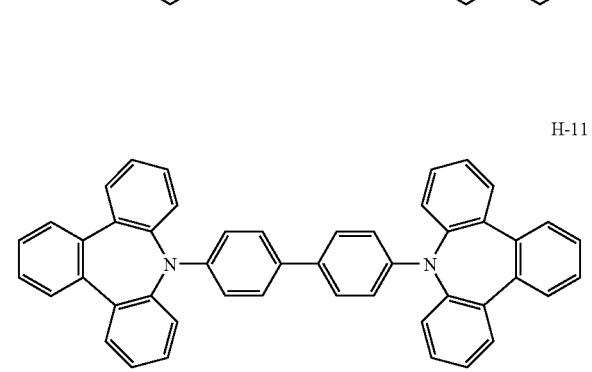
H-12
H-13
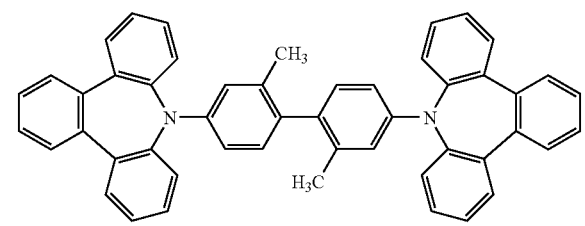

-continued
H-14
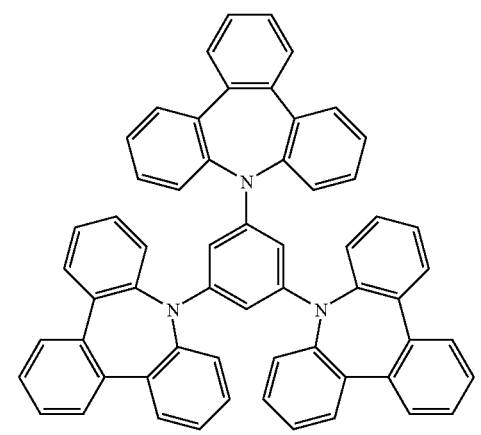
H-15
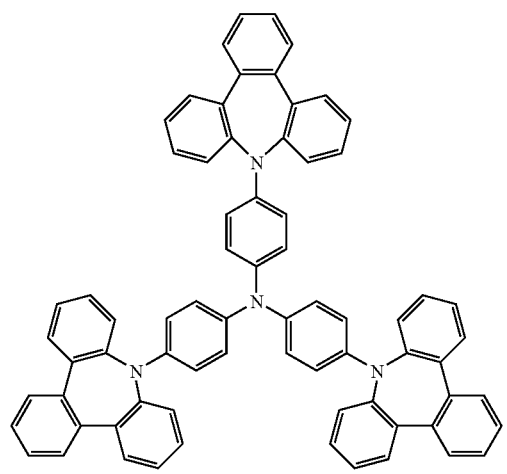
H-16
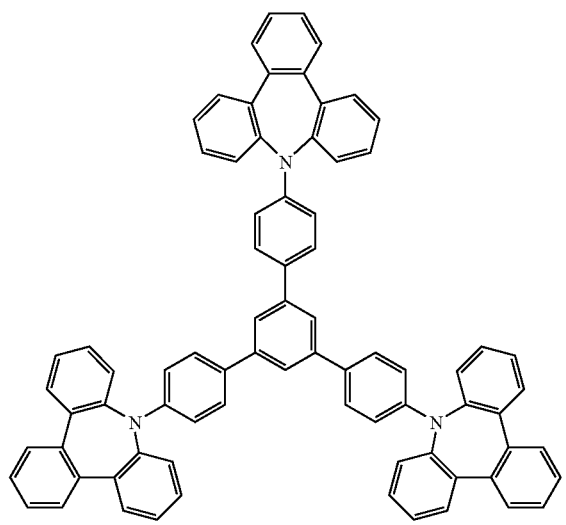
-continued
H-17
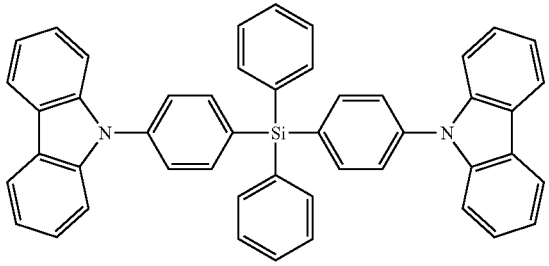
H-18
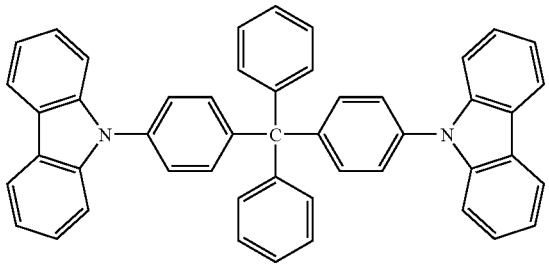
H-19
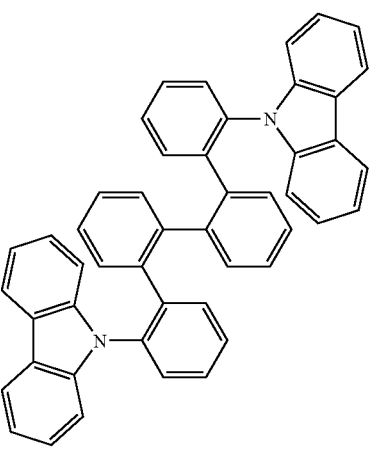
H-20
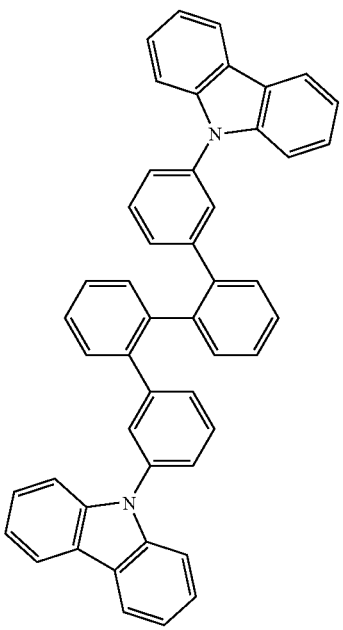

-continued
H-21
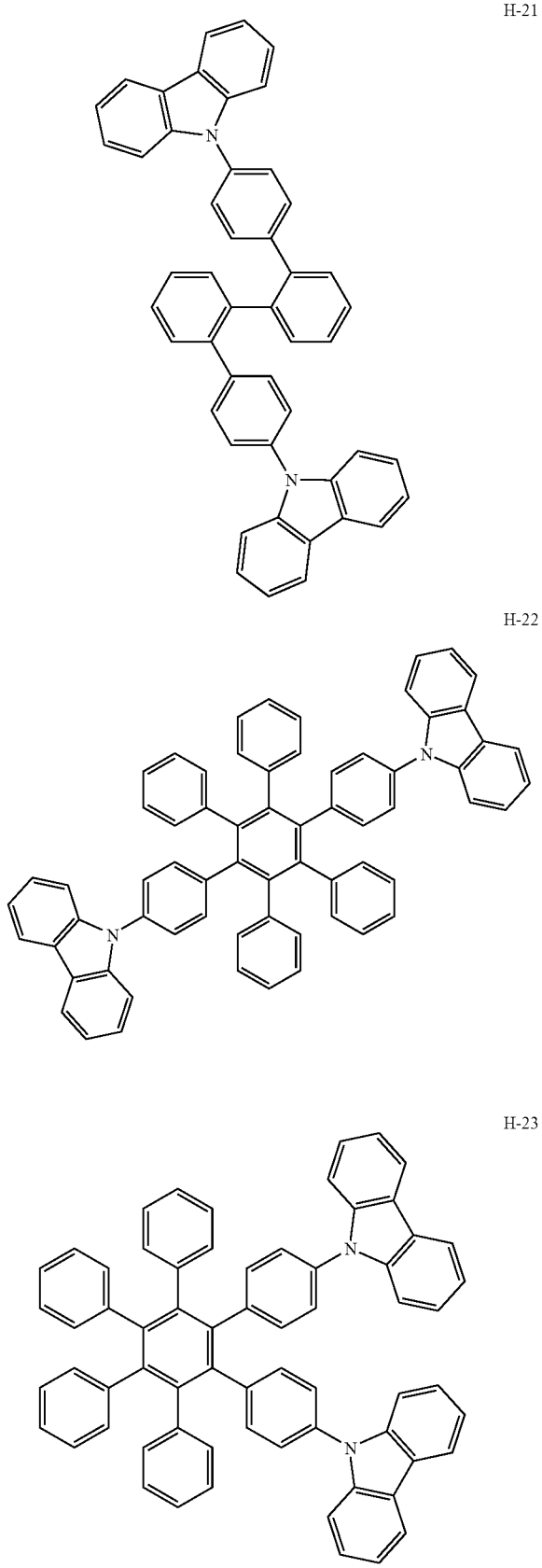
H-22
H-23
-continued
H-24
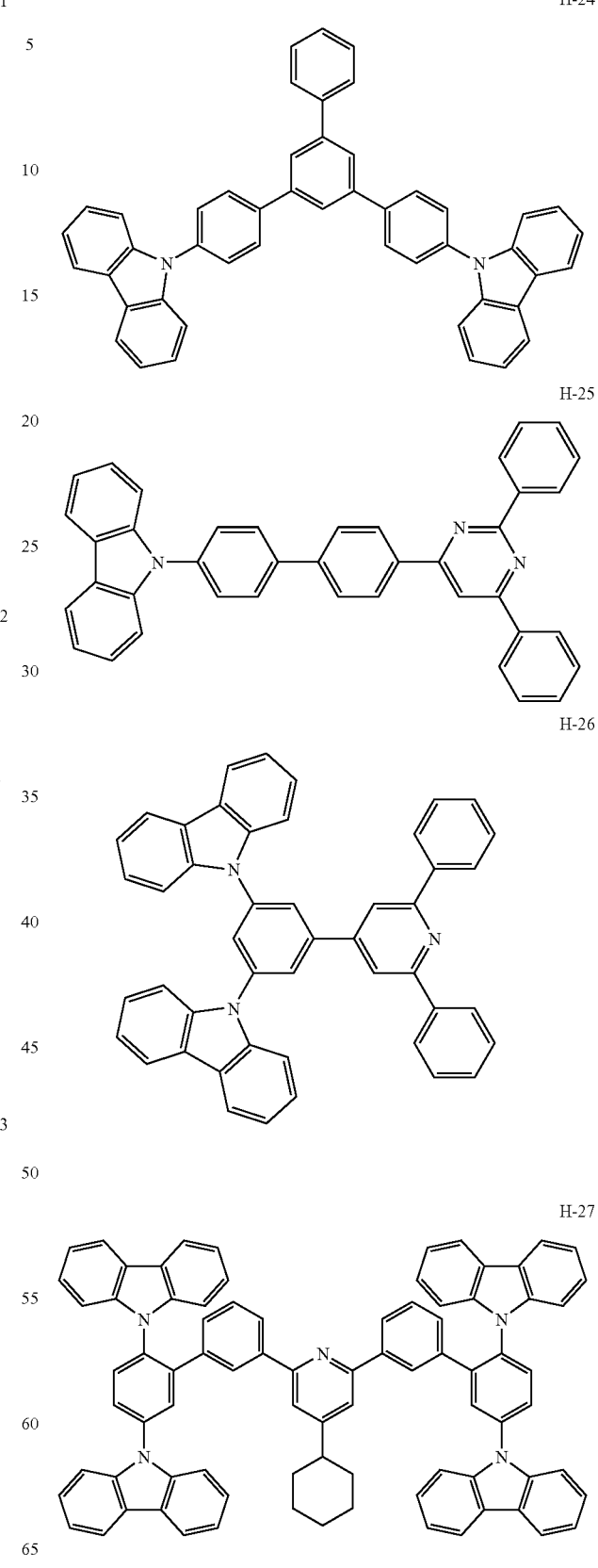
H-25
H-26
H-27

-continued
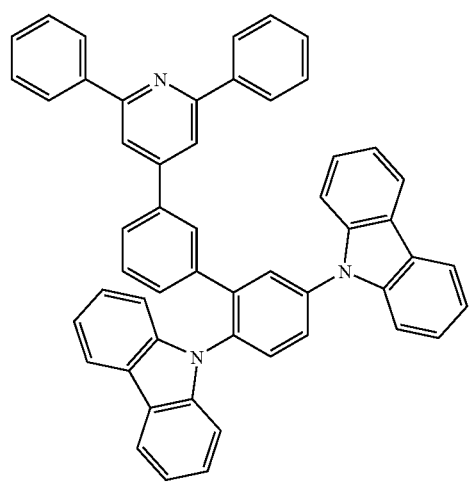
H-28
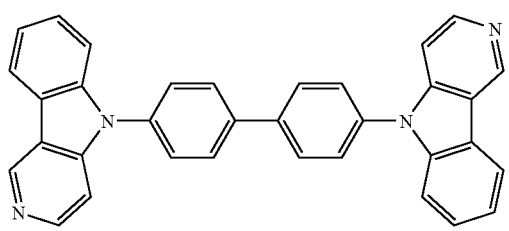
H-29
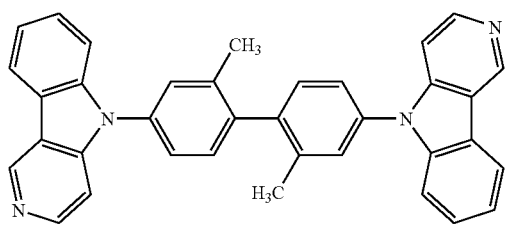
H-30
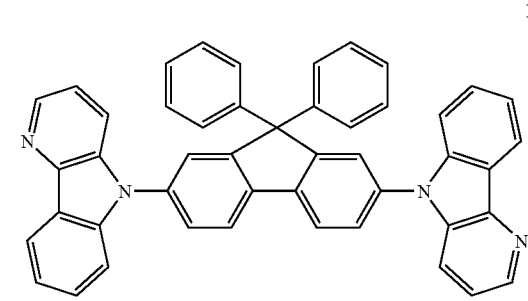
H-31
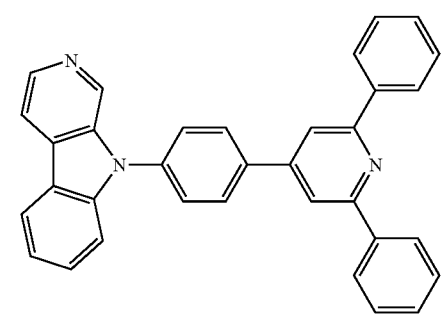
H-32
-continued
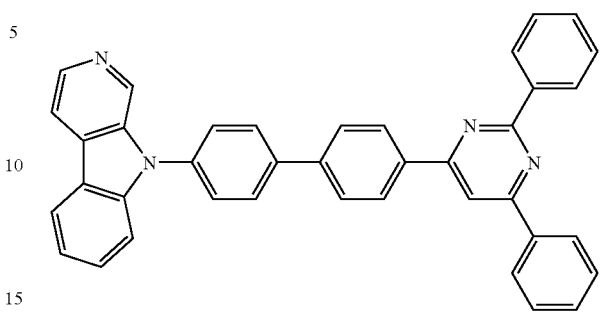
H-33
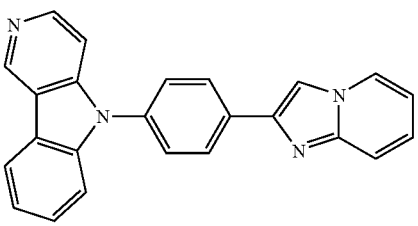
H-34
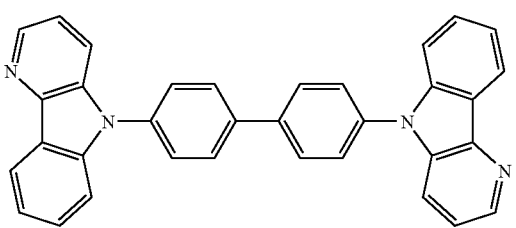
H-35
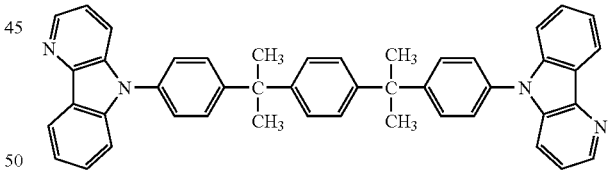
H-36
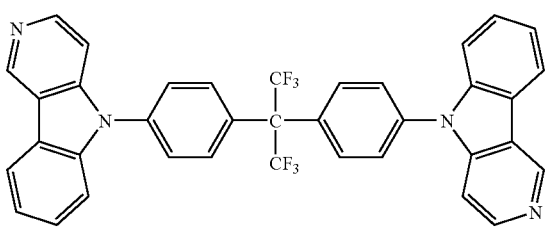
H-37

-continued

H-38

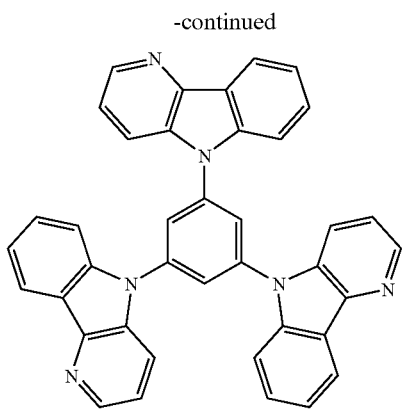

Compounds H-1 to H-21 are preferable, compounds H-1 to H-18 are more preferable, and compounds H-1, H-4 to H-6, H-12, H-14, H-17 and H-18 are further preferable as the hole transportable hosts.

=Electron Transportable Host=

The electron transportable host in the luminescent layer used in the invention has an electron affinity Ea preferably from 2.5 eV or more to 3.5 eV or less, more preferably from 2.6 eV or more to 3.2 eV or less, and further preferably from 2.8 eV or more to 3.1 eV or less from the viewpoint of improving durability and decreasing the driving voltage. The ionization potential is preferably form 5.7 eV or more to 7.5 eV or less, more preferably from 5.8 eV or more and 7.0 eV or less, and further preferably from 5.9 eV or more to 6.5 eV or less from the viewpoint of improving durability and decreasing the driving voltage.

Specific examples of the material of the electron transportable host are as follows.

They include pyridine, pyrimidine, triazine, imidazole, pyrazole, triazole, oxazole, oxadiazole, fuluorenone, anthraquinone dimethane, anthrone, diphenyl quinone, thiopyrane dioxide, carbodiimide, fluolenylidene methane, distyryl pyridine, fluorine-substituted aromatic compounds, heterocyclic tetracerboxyl anhydride such as naphthalene perylene, phthalocyanine and its derivatives (may form a condensed ring with other rings), metal complexes of 8-quinolinol derivatives, and various metal complexes represented by metal phthalocyanine and metal complexes comprising benzooxazole and benzothiazole as ligands.

The electron transportable hosts are preferably metal complexes, azole derivatives (such as benzimidazole derivatives and triazine derivatives), azine derivatives (pyridine derivatives, pyrimidine derivatives and triazine derivatives). Metal complex compounds are preferable in the invention from the viewpoint of durability. Metal complex compound (A) is more preferably a metal complex having ligands containing at least one nitrogen atom, oxygen atom or sulfur atom that coordinate to the metal.

While the metal ion in the metal complex is not particularly restricted, it is preferably beryllium ion, magnesium ion, aluminum ion, gallium ion, zinc ion, indium ion, tin ion, platinum ion and palladium ion; more preferably beryllium ion, aluminum ion, gallium ion, zinc ion, platinum ion and palladium ion; and further preferably aluminum ion, zinc ion and palladium ion.

While various ligands are known as the ligand contained in the metal complex, examples of them include those described by H. Yersin, Photochemistry and Photophysics of Coordination Compounds, Springer-Verlag, 1987; and Akio Yamamoto, Organometallic Chemistry—Basis and Applications, Shokabo, 1982.

The ligand is preferably a nitrogen-containing ligand (preferably having 1 to 30, more preferably 2 to 20, and particularly from 3 to 15 carbon atoms), and the ligand may be a monodentate ligand or a bidentate or higher ligand. Ligands of bidentate or more and hexadentate or less are preferable. Mixed ligands of bidentate or more and hexadentate or less are also preferable.

Examples of the ligand include azine ligands (for example pyridine ligand, bipyridyl ligand and terpyridine ligand), hydroxyphenly azole ligands (for example hydroxyphenyl benzimidazole ligand, hydroxyphenyl benzoxazole ligand, hydroxyphenyl imidazole ligand and hydroxyphenyl imidazopyridine ligand), alkoxy ligands (preferably having 1 to 30, more preferably 1 to 20, and particularly 1 to 10 carbon atoms; for example methoxy, ethoxy, butoxy and 2-ethylsiloxy ligands), aryloxy ligands (preferably having 6 to 30, more preferably 6 to 20, and particularly 6 to 12 carbon atoms; for example phenyloxy, 1-naphthyloxy, 2-naphthyloxy, 2,4,6-trimethylphenyloxy and 4-biphanyloxy ligands), heteroaryloxy ligands (preferably having 1 to 30, more preferably 1 to 20, and particularly 1 to 12 carbon atoms; for example pyridyloxy, pyrazyloxy, pyrimidyloxy and quinolyloxy ligands), alkylthio ligands (preferably having 1 to 30, more preferably 1 to 20, and particularly 1 to 12 carbon atoms; for example methylthio and ethylthio ligands), arylthio ligands (preferably having 6 to 30, more preferably 6 to 20, and particularly 6 to 12 carbon atoms; for example phenylthio ligand), heteroarylthio ligands (preferably having 1 to 30, more preferably 1 to 20, and particularly 1 to 12 carbon atoms; for example pyridylthio, 2-benzimizolylthio, 2-benzoxazolylthio and 2-benzthiazolylthio ligands), siloxy ligands (preferably having 1 to 30, more preferably 3 to 25, and particularly 6 to 20 carbon atoms; for example triphenylsiloxy, triethoxysiloxy and triisopropylsiloxy ligands), aromatic hydrocarbon anion ligands (preferably having 6 to 30, more preferably 6 to 25, and particularly 6 to 20 carbon atoms; for example phenyl anion, naphthyl anion and anthracenyl anion ligands), aromatic heterocyclic anion ligands (preferably having 1 to 30, more preferably 2 to 25, and particularly 2 to 20 carbon atoms; for example pyrrole anion, pyrazole anion, triazole anion, oxazole anion, banzoxazole anion, thiazole anion, benzothiazole anion, thiophene anion and benzothiophene anion ligands) and indolenine anion ligands. Nitrogen-containing heterocyclic ligands, aryloxy ligands, hetero-aryloxy ligands and siloxy ligands are preferable; and nitrogen-containing heterocyclic ligands, aryloxy ligands, siloxy ligands, aromatic hydrocarbon anion ligands and aromatic heterocyclic anion ligands are more preferable.

Examples of the metal complex electron transportable host are compounds described in JP-A Nos. 2002-235076, 2004-214179, 2004-221062, 2004-221065, 2004-221068 and 2004-327313.

While examples of such electron transportable hosts include compounds (E-1 to E-22) below, they are not restricted thereto.

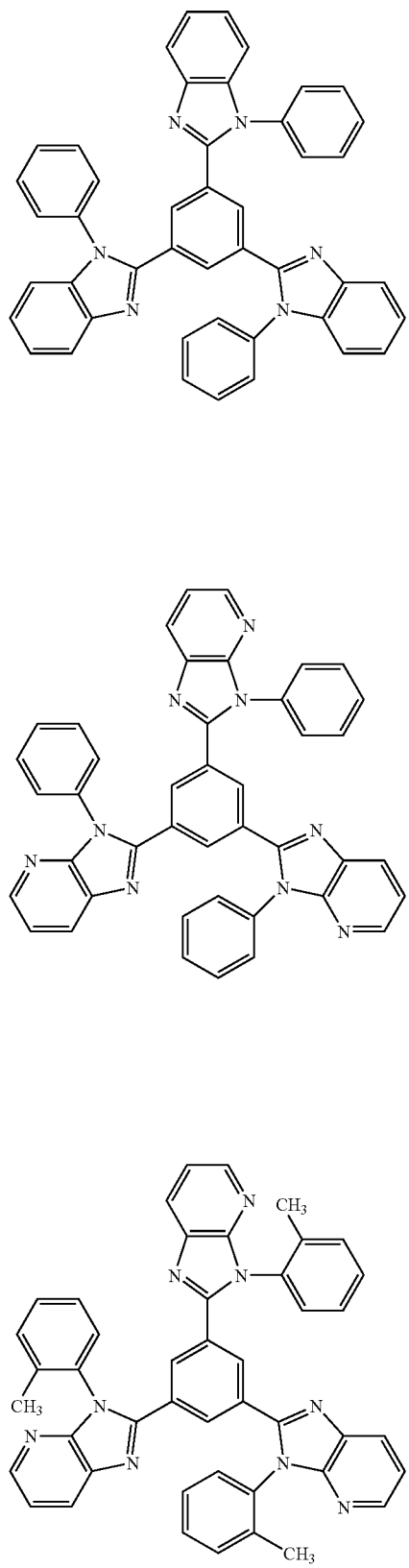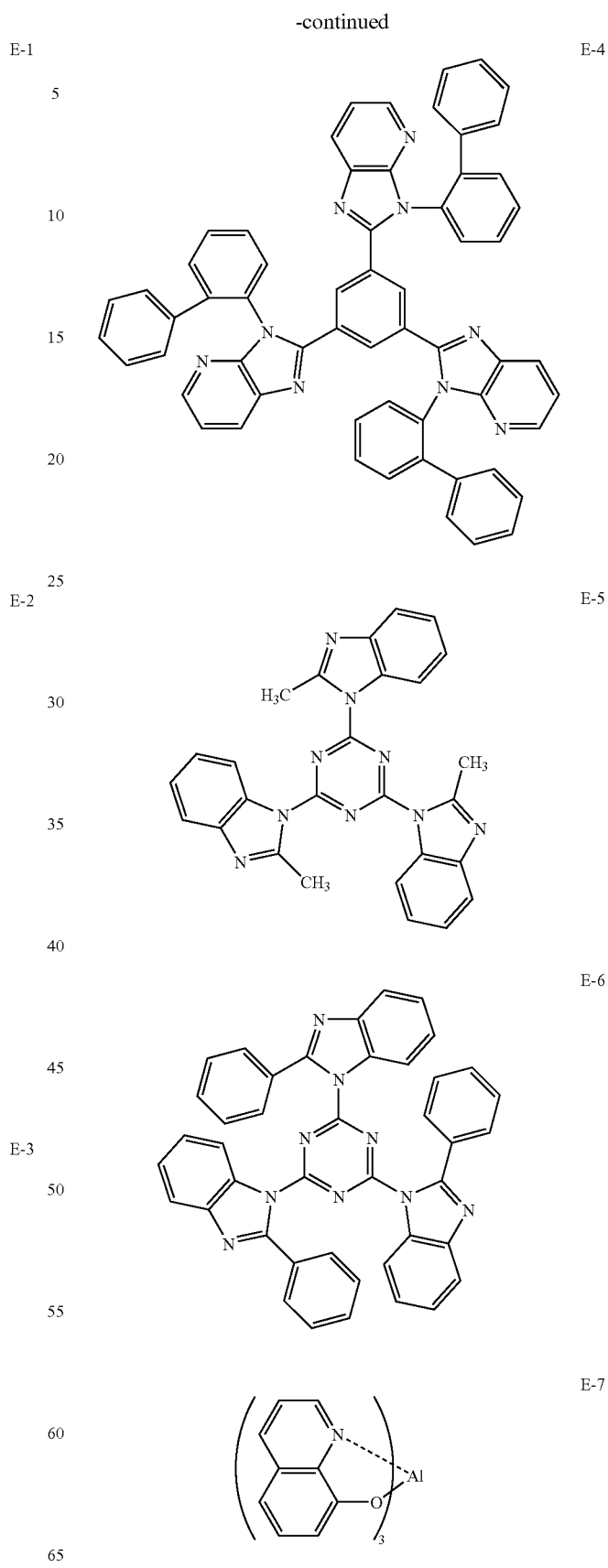

-continued
E-8
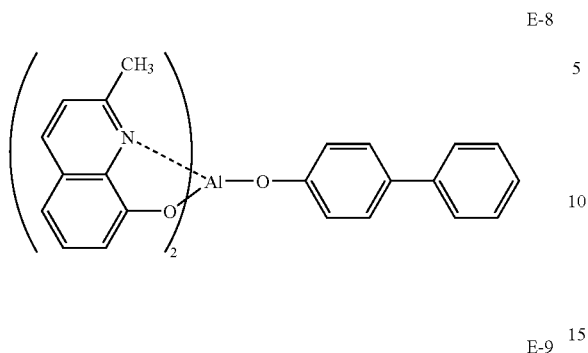
E-9
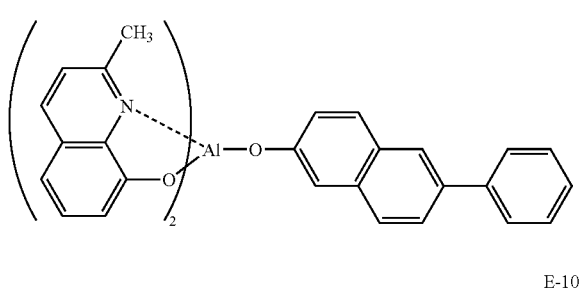
E-10
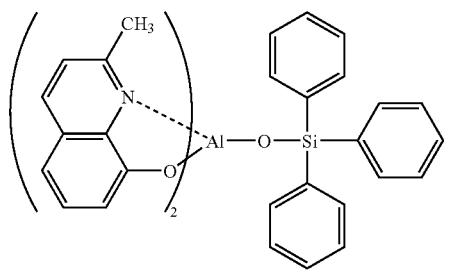
E-11
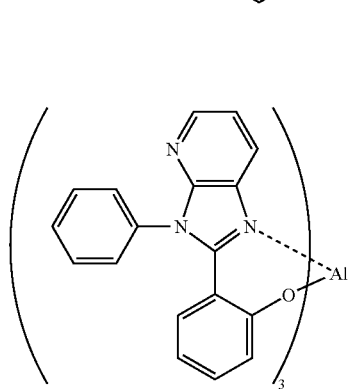
E-12
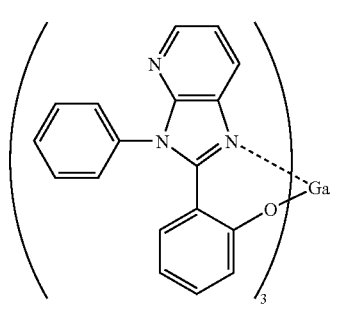
-continued
E-13
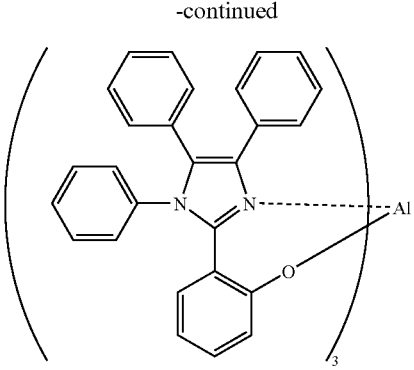
E-14
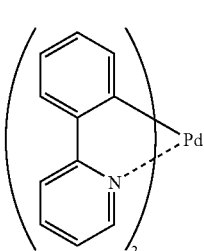
E-15
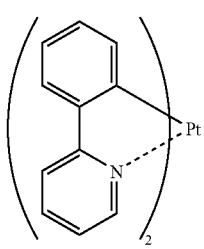
E-16
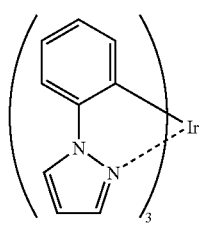
E-17
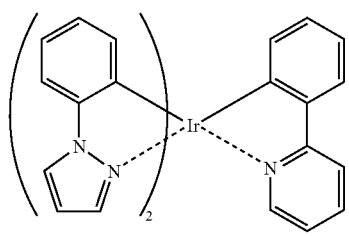
E-18
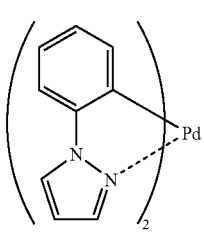

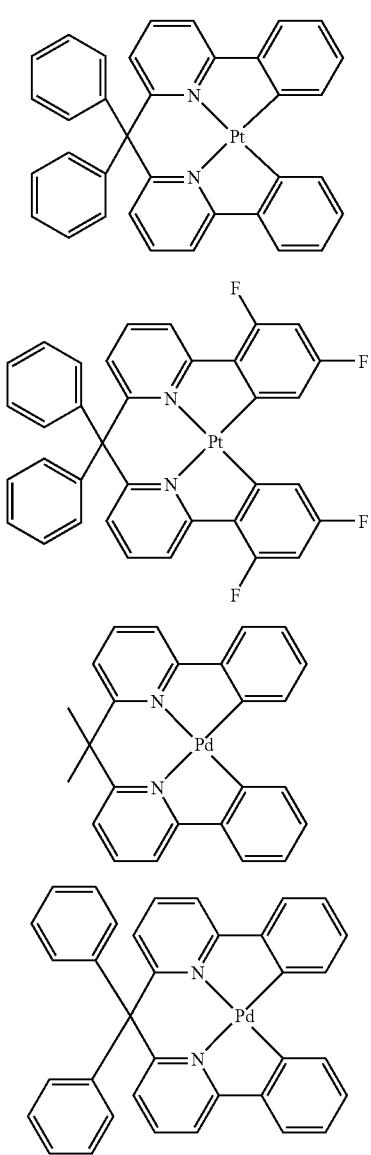

Compounds E-1 to E-6, E-8, E-9, E-21 and E-22 are preferable, compounds E-3, E-4, E-6, E-8, E-9, E-10, E-21 and E-22 are more preferable, and compounds E-3, E-4, E-21 and E-22 are further preferable as the electron transportable host.

When the phosphorescent dopant is used as the luminescent in the luminescent layer of the invention, it is preferable from the viewpoint of color purity, luminous efficiency and running durability that the lowest triplet driving energy $T_1(D)$ of the phosphorescent dopant and the smallest $T_1(H)$min of the lowest triplet driving energy of the plural host compounds described above satisfies the relation of $T_1(H)min>T_1(D)$.

While the contents of two or more of host materials contained in the luminescent layer are not particularly restricted, each content is preferably from 15% by mass or more to 85% by mass or less relative to the total amount of the compounds forming the luminescent layer from the viewpoint of luminous efficiency and driving voltage.

The mobility of the carrier in the luminescent layer is usually from $10^{-7}$ cm$^2 \cdot$V$^{-1} \cdot$s$^{-1}$ or more to $10^{-1}$ cm$^2 \cdot$V$^{-1} \cdot$s$^{-1}$ or less. The mobility is preferably from $10^{-6}$ cm$^2 \cdot$V$^{-1} \cdot$s$^{-1}$ or more to $10^{-1}$ cm$^2 \cdot$V$^{-1} \cdot$s$^{-1}$ or less, further preferably from $10^{-5}$ cm$^2 \cdot$V$^{-1} \cdot$s$^{-1}$ or more to $10^{-1}$ cm$^2 \cdot$V$^{-1} \cdot$s$^{-1}$ or less, and particularly form $10^{-4}$ cm$^2 \cdot$V$^{-1} \cdot$s$^{-1}$ or more to $10^{-1}$ cm$^2 \cdot$V$^{-1} \cdot$s$^{-1}$ or less from the viewpoint of luminous efficiency.

It is preferable from the viewpoint of luminous efficiency and durability against driving that the mobility of the carrier in the luminescent layer is smaller than the mobility of the carrier in the carrier transport layer to be described below.

The mobility of the carrier was measured by Time of Flight method.

(Hole-Injecting Layer and Hole Transport Layer)

The hole-injecting layer and hole transport layer serve for receiving the hole from the anode or anode side, and for transporting the hole to the cathode side.

Specifically, the hole-injecting layer and hole transport layer preferably contain pyrrole derivatives, carbazole derivatives, pyrazole derivatives, triazole derivatives, oxazole derivatives, oxadiazole derivatives, imidazole derivatives, polyaryl alkane derivatives, pyrazoline derivatives, pyrazolone derivatives, phenylenediamine derivatives, aryl amine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidene compound, porphyrin compounds, organic silane derivatives or carbon.

Materials not contained in the luminescent layer are preferably selected as the materials for the hole-injecting layer and hole transport layer.

While the thickness of the hole injecting-layer and hole transport layer is not particularly restricted, it is preferably from 1 nm to 5 μm, more preferably from 5 nm to 1 μm, and particularly from 10 nm to 500 nm from the viewpoint of decreasing the driving voltage and improving luminous efficiency and durability.

It is possible to include an electron acceptor dopant and the like in a hole injecting layer or hole transport layer of the organic EL element of the invention. As the electron acceptor dopant introduced into the hole injecting layer, or the hole transport layer, inorganic compounds or organic compounds can be used as long as they have an electron accepting property that oxidizes organic compounds.

Specific examples that can be given of inorganic compounds are metal halides such as ferric chloride and aluminum chloride, gallium chloride, indium chloride, and antimony pentachloride and the like, and metal oxides such as vanadium pentoxide, molybdenum trioxide, and the like.

For organic compounds, compounds having substituent groups of nitro groups, halogens, cyano groups, trifluoromethyl groups, and the like, quinine based compounds, acid anhydrides, fullerenes and the like can be appropriately used.

Also compounds disclosed in Japanese Patent Application Laid-Open (JP-A) Nos. H6-212153, H11-111463, H11-251067, 2000-196140, 2000-286054, 2000-315580, 2001-102175, 20001-160493, 2002-252085, 2002-56985, 2003-157981, 2003-217862, 2003-229278, 2004-342614, 2005-72012, 2005-166637, and 2005-209643 can be appropriately used.

These electron acceptor dopants can be used singly or 2 or more can be used. The amount of electron acceptor dopant used varies dependent on the type of material, but it is preferably of an amount that is 0.01% to 50% by mass with respect to the material for the hole transport layer, and more preferably 0.05% to 20% by mass, with 0.1% to 10% by mass being particularly preferred.

By the including the above electron acceptor dopants the driving voltage can be reduced.

Each of the hole injecting layer and hole transport layer may have a single-layer structure containing one or more of the materials described above, or a multi-layer structure containing plural layers having the same composition or different compositions.

Ip(HTL) of the hole transport layer is preferably smaller than Ip(D) of the dopant contained in the luminescent layer from the viewpoint of durability against driving.

Ip(HTL) in the hole transport layer can be measured by the method for measuring Ip described below.

The mobility of the carrier in the hole transport layer is usually from $10^{-7}$ cm$^2 \cdot$V$^{-1} \cdot$s$^{-1}$ or more to $10^{-1}$ cm$^2 \cdot$V$^{-1} \cdot$s$^{-1}$ or less. The mobility is preferably from $10^{-5}$ cm$^2 \cdot$V$^{-1} \cdot$s$^{-1}$ or more to $10^{-1}$ cm$^2 \cdot$V$^{-1} \cdot$s$^{-1}$ or less, further preferably from $10^{-4}$ cm$^2 \cdot$V$^{-1} \cdot$s$^{-1}$ or more to $10^{-1}$ cm$^2 \cdot$V$^{-1} \cdot$s$^{-1}$ or less, and particularly form $10^{-3}$ cm$^2 \cdot$V$^{-1} \cdot$s$^{-1}$ or more to $10^{-1}$ cm$^2 \cdot$V$^{-1} \cdot$s$^{-1}$ or less from the viewpoint of luminous efficiency.

The mobility of the carrier is measured by the same method as that for measuring the mobility of the carrier in the luminescent layer.

It is preferable from the viewpoint of durability against driving and luminous efficiency that the mobility of the carrier in the hole transport layer is larger than the mobility of the carrier in the luminescent layer.

(Electron-Injecting Layer and Electron Transport Layer)

The electron-injecting layer and electron transport layer are layers having any one of functions for injecting electrons from the cathode, for transporting the electrons and for blocking holes injected from the anode.

Specific examples of the materials for the electron-injecting layer and electron transport layer include pyridine, pyrimidine, triazine, imidazole, triazole, oxazole, oxadiazole, fluorenone, anthraquinone dimethane, anthrone, diphenyl quinone, thiopyrane dioxide, carbodiimide, fluorenylidene methane, distyryl pyrazine, fluorine-substituted aromatic compounds, heterocyclic tetracarboxylic acid anhydride such as naphthalene perylene, phthalocyanine, silol, phenantoroline and derivatives thereof (may form a condensation ring with other rings), metal complexes of 8-quinolinol derivatives, metal phthalocyanine, and various metal complexes represented by metal complexes having ligands such as banzoxazole and benzothiazole.

It is preferable to select materials not contained in the luminescent layer as the materials for the electron-injecting layer and electron transport layer.

While the thickness of the electron-injecting layer and electron transport layer is not particularly restricted, from the view point of reducing the driving voltage, increasing emission efficiency, and running durability it is preferably from 1 nm to 5 μm, more preferably from 5 nm to 1 μm, and particularly from 10 nm to 500 nm.

It is possible to include an electron donor dopant and the like in an electron injecting layer or electron transport layer of the organic EL element of the invention. As the electron donor dopant introduced into the electron injecting layer, or the electron transport layer, compounds which have an electron donating property that reduce organic compounds can be used, and alkali metals such as lithium, alkaline earth metals such as magnesium, transition metals including rare earth metals and organic compounds with reducing properties can be favorably used. For metals, metals with a work function of 4.2 eV or less can be favorably used, and specific examples which can be given are Li, Na, K, Be, Mg, Ca, Sr, Ba, Y, Cs, La, Sm, Gd and Yb. Further, examples which can be given of organic compounds with reducing properties are nitrogen containing compounds, sulfur containing compounds, and phosphorous containing compounds.

Also, materials disclosed in Japanese Patent Application Laid-Open (JP-A) Nos. H6-212153, 2000-196140, 2003-68468, 2003-229278 and 2004-342614 can be used.

These electron donor dopants can be used singly or 2 or more can be used. The amount of electron donor dopant used varies dependent on the type of material, but it is preferably of an amount that is 0.1% to 99% by mass with respect to the material for the electron transport layer, and more preferably 1.0% to 80% by mass, with 2.0% to 70% by mass being particularly preferred.

By the inclusion of the above electron donor dopants the driving voltage can be reduced.

While the electron-injecting layer and electron transport layer may have a single layer structure containing one or more of the materials described above, or a multi-layer structure containing the same component or plural components.

When the carrier transport layer adjacent to the luminescent layer serves as a electron transport layer, Ea(ETL) of the electron transport layer is preferably larger than Ea(D) of the dopant contained in the luminescent layer from the viewpoint of durability against driving.

Ea(ETL) used is measured by the same method as the method for measuring Ea described below.

The mobility of the carrier in the electron transport layer is usually from $10^{-7}$ cm$^2 \cdot$V$^{-1} \cdot$s$^{-1}$ or more to $10^{-1}$ cm$^2 \cdot$V$^{-1} \cdot$s$^{-1}$ or less. The mobility is preferably from $10^{-5}$ cm$^2 \cdot$V$^{-1} \cdot$s$^{-1}$ or more to $10^{-1}$ cm$^2 \cdot$V$^{-1} \cdot$s$^{-1}$ or less, further preferably from $10^{-4}$ cm$^2 \cdot$V$^{-1} \cdot$s$^{-1}$ or more to $10^{-1}$ cm$^2 \cdot$V$^{-1} \cdot$s$^{-1}$ or less, and particularly form $10^{-3}$ cm$^2 \cdot$V$^{-1} \cdot$s$^{-1}$ or more to $10^{-1}$ cm$^2 \cdot$V$^{-1} \cdot$s$^{-1}$ or less from the viewpoint of luminous efficiency.

It is preferable from the viewpoint of durability against driving that the mobility of the carrier in the electron transfer layer is larger than the mobility of the carrier in the luminescent layer. The mobility of the carrier was measured by the same method as that for measuring the mobility in the hole transport layer.

It is preferable from the viewpoint of durability against driving that the mobility of carriers in the invention, or the mobility of the carrier in the hole transport layer, electron transport layer and luminescent layer, satisfies the relation of (electron transport layer≧hole transport layer)>luminescent layer.

(Hole Block Layer)

The hole block layer serves for preventing the holes transported from the anode side to the luminescent layer from getting through to the cathode side. A hole block layer may be provided in the invention as an organic compound layer at the cathode side of the luminescent layer. The hole block layer is preferably formed between the luminescent layer and electron transfer layer, or between an electron transportable buffer layer and electron transport layer when the electron transportable buffer layer is provided.

While the hole block layer is not particularly restricted, the layer may specifically contain an aluminum complex such as BAlq, triazole derivatives, triazine derivatives, pyridine derivatives, quinoline derivatives phenantolorine derivatives and pyrazabole derivatives.

The thickness of the hole block layer is usually 50 nm or less, and preferably from 1 to 50 nm, further preferably from 5 to 40 nm, for reducing the driving voltage.

Anode

It would be usually sufficient for the anode as long as it has the function as an electrode supplying holes to the organic compound layer. There is no limitation on the shape, structure, size or the like, and the material can be appropriately selected from known electrode materials depending on the intended use and purpose of the luminescent element. As described above, the anode is typically furnished as a transparent anode.

As for the material for the anode, mention may be suitably made of, for example, metals, alloys, metal oxides, electroconductive compounds or mixtures thereof, and preferred is a material having a work function of 4.0 eV or greater. Specific examples of the anode material include electroconductive metal oxides such as tin oxide doped with antimony or fluorine (ATO, FTO), tin oxide, zinc oxide, indium oxide, indium tin oxide (ITO), and zinc indium oxide (IZO); metals such as gold, silver, chromium, and nickel; as well as mixture or laminates of such metals and electroconductive metal oxides; inorganic electroconductive materials such as copper iodide, and copper sulfate; organic electroconductive materials such as polyaniline, polythiophene, and polypyrrole; and laminates of these substances with ITO. Preferred among these is an electroconductive metal oxide, and particularly preferred is ITO in the aspects of productivity, high conductivity and transparency.

The anode can be formed on the above-described substrate according to a method appropriately selected, in consideration of the suitability to the material constituting the anode, for example, from wet methods such as printing and coating, physical methods such as vacuum deposition, sputtering and ion plating, and chemical methods such as CVD and plasma CVD. For example, when ITO is selected as the material for anode, formation of the anode can be carried out by DC sputtering or radiofrequency sputtering, vacuum deposition, ion plating or the like.

In the organic electroluminescent element of the invention, the anode can be formed in any part of the luminescent element selected according to the intended use and purpose thereof, without particular limitation. It is preferred that the anode is formed on the substrate. In this case, the anode may be formed on the entire surface of one side of the substrate, or in a part of such surface.

Moreover, patterning during the formation of an anode may be carried out by means of chemical etching involving photolithography or the like, or by means of physical etching involving laser or the like. Further, it may be also carried out by vacuum deposition or sputtering with repeated masking, or may be carried out by the lift-off method or printing method.

The thickness of the anode can be appropriately selected in accordance with the material constituting the anode and thus cannot be indiscriminately defined. It is usually from 10 nm to 50 nm, and preferably from 50 nm to 20 nm.

The resistance value of the anode is preferably $10^3 \Omega/\square$ or less, and more preferably $10^2 \Omega/\square$ or less. When the anode is transparent, it may be colorless and transparent, or colored and transparent. In order to obtain luminescence from the transparent anode side, the transmission is preferably 60% or higher, and more preferably 70% or higher. In addition, a transparent anode is described in detail in "Tohmeidenkyokumaku No Shintenkai (New Development of Transparent Electrode Films)" supervised by Yutaka Sawada, CMC Inc. (1999), the description of which is applicable to the invention. In case of using a plastic base with low heat resistance, it is preferable to employ ITO or IZO and a transparent anode film formed at a low temperature of 150□ or below.

Cathode

It is usually sufficient for a cathode as long as it has the function as an electrode of injecting electrons to the organic compound layer. There is no limitation on the shape, structure, size or the like, and the material can be appropriately selected from known electrode materials depending on the intended use and purpose of the luminescent element. As for the material constituting the cathode, mention may be suitably made of, for example, metals, alloys, metal oxides, electroconductive compounds or mixtures thereof, and preferred is a material having a work function of 4.5 eV or less. Specific examples of the cathode material include alkali metals (e.g., Li, Na, K, Cs, etc.), alkaline earth metals (e.g., Mg, Ca, etc.), gold, silver, lead, aluminum, sodium-potassium alloys, lithium-aluminum alloys, magnesium-silver alloys, rare earth metals such as indium, and ytterbium. They may be used individually, or from the viewpoint of achieving both stability and the electron injection property, they may be suitably used in combination of two or more species.

Among these, as for the material constituting the cathode, alkali metals or alkaline earth metals are preferred from the viewpoint of the electron injection property, and materials mainly comprising aluminum are preferred in the viewpoint of excellent storage stability.

The materials mainly comprising aluminum include aluminum itself, and alloys or mixtures comprising aluminum and 0.01 to 10% by mass of alkali metals or alkaline earth metals (e.g., lithium-aluminum alloys, magnesium-aluminum alloys, etc.).

In addition, the materials for the cathode are described in detail in the publications of JP-A 2-15595 and JP-A 5-121172, the descriptions of which are applicable to the invention. The method for formation of a cathode is not particularly limited and may be carried out according to a known method. The cathode can be formed according to a method appropriately selected, in consideration of the suitability to the aforementioned material constituting the cathode, for example, from wet methods such as printing and coating, physical methods such as vacuum deposition, sputtering and ion plating, and chemical methods such as CVD and plasma CVD. For example, in the case of selecting a metal or the like as the material for the cathode, the formation can be carried out by simultaneous or successive sputtering of one, or two or more species.

Patterning during the formation of the cathode may be carried out by means of chemical etching involving photolithography or the like, or by means of physical etching involving laser or the like. Further, it may be also carried out by vacuum deposition or sputtering with repeated masking, or may be carried out by the lift-off method or printing method.

In the invention, there is no particular limitation on the location of the cathode formed, and the cathode may be formed all over the organic compound layer, or in a part thereof.

Further, a dielectric layer of 0.1 to 5 nm in thickness, comprising a fluoride, oxide or the like of an alkali metal or an alkaline earth metal may be inserted in between the cathode and the aforementioned organic compound layer. This dielectric layer can be viewed as a type of electron-injecting layer. The dielectric layer can be formed by, for example, vacuum deposition, sputtering, ion plating or the like.

The thickness of the cathode can be appropriately selected in accordance with the material constituting the cathode and thus cannot be indiscriminately defined. It is usually from 10 nm to 5 nm, and preferably from 50 nm to 1 nm. Also, the cathode may be transparent or opaque. In addition, a transparent cathode can be formed by forming a film of a cathode material having a thickness of 1 to 10 nm and further laminating thereon a transparent electroconductive material such as ITO or IZO.

The substrate used in the invention is preferably a substrate which does not scatter or attenuate the light emitted from the organic compound layer. Specific examples thereof include inorganic materials such as yttria-stabilized zirconia (YSZ), and glass; polyesters such as polyethylene terephthalate, polybutylene phthalate, and polyethylene naphthalate; and organic materials such as polystyrene, polycarbonate, polyethersulfone, polyallylate, polyimide, polycycloolefin, norbornene resins, and poly(chlorotrifluoroethylene).

For example, when glass is used for the substrate, it is preferable to use a non-alkali glass as the substrate material, in order to reduce the ions eluting from the glass. Also, when soda lime glass is used, it is preferable to use one having a barrier coat such as silica or the like. In the case of using organic materials, preferred are those having excellent heat resistance, dimensional stability, solvent resistance, electrical insulating property and processability.

The shape, structure, size and the like of the substrate are not particularly limited and can be selected appropriately in accordance with the intended use, purpose and the like of the luminescent element. In general, the substrate is preferably plate-shaped. The structure of the substrate may be either a monolayer structure or a laminated structure. Further, the substrate may be made of a single material or of two or more materials.

The substrate may be colorless and transparent, or colored and transparent, but in view of not scattering or attenuating the light emitted from the organic luminescent layer, a colorless and transparent substrate is preferred.

The substrate can be provided with a layer preventing moisture permeation (gas barrier layer) on the surface or the inner side.

As for the material for the layer preventing moisture permeation (gas barrier layer), inorganic substances such as silicon nitride, silicon oxide or the like are suitably used. The layer preventing moisture permeation (gas barrier layer) can be formed, for example, by radiofrequency sputtering or the like.

When a thermoplastic substrate is used, a hard coat layer, an undercoat layer or the like may be further provided, if necessary.

(Protective Layer)

The entire organic EL element of the invention may be protected with a protective layer.

Any materials are available as the material contained in the protective layer so long as it has a function for blocking substances that accelerate deterioration of the element such as water and oxygen.

Examples of the material contained in the protective layer include metals such as In, Sn, Pb, Au, Cu, Ag, Al, TI and Ni; metal oxides such as MgO, SiO, $SiO_2$, $Al_2O_3$, GeO, NiO, CaO, BaO, $Fe_2O_3$, $Y_2O_3$ and $TiO_2$; metal nitrides such as $SiN_x$ and $SiN_xO_y$; metal fluorides such as $MgF_2$, LiF, $AlF_3$ and $CaF_2$; and polyethylene, polypropylene, polymethyl methacrylate, polyimide, polyurea, polytetrafluoroethylene, polychlorotrifluoroethylene, polydichlorodifluoroethylene, a copolymer of chlorotrifluoroethylene and dichlorodifluoroethylene, a copolymer obtained by copolymerization of a monomer mixture comprising tetrafluoroethylene and at least one comonomer, a fluorine-containing copolymer having cyclic structured in the main chain of the copolymer, and water-absorbing substances with a water absorption coefficient of 1% or more and moisture-proof substances with a water absorption coefficient of 0.1% or less.

The method for forming the protective layer is not particularly restricted and, for example, a vacuum deposition method, sputtering method, reactive sputtering method, MBE (molecular beam epitaxial) method, cluster ion beam method, ion plating method, plasma polymerization method (high frequency-excited ion plating method), plasma CVD method, laser CVD method, Heat CVD method, gas-source CVD method, coating method, printing method and transcription method are available.

(Sealing)

The entire organic EL element of the invention may be sealed in a sealing vessel.

A water absorbing agent or an inert liquid may be sealed in the space between the sealing vessel and luminescent element. While the water absorbing agent is not particularly restricted, examples thereof include barium oxide, sodium oxide, potassium oxide, calcium oxide, sodium sulfate, calcium sulfate, magnesium sulfate, phosphorous pentoxide, calcium chloride, magnesium chloride, copper chloride, cesium fluoride, niobium fluoride, calcium bromide, vanadium bromide, molecular sieve, zeolite and magnesium oxide. While the inert liquid is not particularly restricted, examples thereof include paraffins, liquid paraffins, fluorinated solvents such as perfluoroalkane, perfluoroamine and perfluoroether, chlorinated solvents and silicone oil.

The organic EL element of the invention emits a light by applying a DC voltage (usually from 2 to 15 volt; may contain an AC component, if necessary) or by allowing a DC current to flow.

Driving durability of the organic EL element according to the invention can be determined by measuring a half-decay period of luminance at a specified luminance level. For example, the organic EL element is allowed to emit a light by applying a DC voltage using Source Measure Unit 2400 (trade name, manufactured by Keithley Instruments Inc.), and the EL element is continuously excited with an initial luminance of 2000 $cd/m^2$. The time when luminance is decreased to 1000 $cd/m^2$ is defined as the half-decay period T(½), and durability of the element is determined by comparing the half-decay period of the element of the invention with that of conventional luminescent elements. This method was used in the invention.

An important characteristic value of the organic EL element of the invention is an external quantum efficiency. The external quantum efficiency is calculated as "External quantum efficiency Φ=(number of photons emitted from the element)/(number of electrons injected to the element)". The larger this value is, the element considered to be the more advantageous with respect to electric power consumption.

The external quantum efficiency is also determined by "External quantum efficiency Φ=(internal quantum efficiency)×(light output efficacy)". Since the threshold value of the internal quantum efficiency is about 25% and light output efficacy is about 20% in the organic EL element that takes advantage of fluorescence from an organic compound, the threshold value of the external quantum efficiency is calculated as about 5%.

The external quantum efficiency of the organic EL element is preferably 6% or more, particularly 12% or more, for enabling electric power consumption to be decreased and durability against driving to be increased.

The maximum value of the external quantum efficiency when the element is excited at 20° C., or the value of the external quantum efficiency from 100 to 300 $cd/m^2$ (preferably at 200 cd/m$^2$) when the element is excited at 20° C. may be used as the external quantum efficiency of the element.

A DC voltage is applied to the EL element using Source Measure Unit 2400 (trade name, manufactured by TOYO Corporation) to emit a light, and the luminance is measured using a luminance meter BM-8 (trade name, manufactured by TOPCON CORPORATION). The external quantum efficiency at 200 cd/m$^2$ is calculated from the measured value, and is used in the invention.

In another method, luminance, emission spectrum and current density are measured, and the external quantum efficiency of the organic EL element can be calculated by comparing these measured values with a relative luminous efficiency curve. In other word, the number of input electrons can be calculated. The luminance can be converted into the number of photons involved in light emission by an integration using the emission spectrum and specific luminosity curve, and the external quantum efficiency (%) can be calculated as "(the number of photons involved in light emission)/(the number of input electrons to the element)" from the result described above.

The ionization potential (Ip), electron affinity (Ea) and triplet state level ($T_1$) according to the invention will be described below.

The ionization potential (Ip), electron affinity (Ea) and triplet state level ($T_1$) are obtained by measuring a single layer film of each material deposited on quartz by vacuum deposition.

The ionization potential is prescribed by a value measured using a UV photoelectron analyzer AC-1 or AC-3 (trade name, manufactured by RIKEN KENKI Co., Ltd.) at room temperature under an atmospheric pressure. The principle of measurement with the LTV photoelectron analyzer is described in "Collection of Data of Work Function of Organic Thin Films", Chihaya Adachi et al., CMC Publishing CO., LTD., 2004.

The electron affinity (Ea) is calculated from a band gap, which is calculated from the long wavelength end of the absorption spectrum of the single layer film, and the ionization potential (Ip) obtained as described above.

The lowest triplet driving energy (triplet state level ($T_1$)) is defined by a value calculated from a short wavelength end of a phosphorescence emission spectrum at room temperature. The measurement may be performed at a liquid nitrogen temperature.

The driving method for the organic EL element of the invention may follow the driving methods described in JP-A Nos. 2-148687, 6-301355, 5-29080, 7-134558, 8-234685 and 8-241047; Japanese Patent No. 2,784,615; and U.S. Pat. Nos. 5,828,429 and 6,023,308.

The organic EL element of the invention may be favorably applied for display elements, displays, backlight, electronic photography, illumination light sources, recording light sources, exposure light sources, reading light sources, marks, sign boards, interior goods and light communication systems.

EXAMPLES

While examples of the organic electroluminescent element of the invention are described with reference to examples, the invention is by no means restricted to these examples.

1. Preparation of Organic Electroluminescent Element

Example 1

An ITO glass substrate (2.5 cm square×0.5 mm thick; manufactured by GEOMATEC Co., Ltd., surface resistance 10Ω/□) was placed in a washing bath and, after ultrasonic cleaning in 2-propanol, the substrate was treated with ozone with UV irradiation for 30 minutes. The following layers were deposited on this transparent anode by vacuum deposition. The deposition rate in this example is 0.2 nm/sec unless otherwise stated. The deposition rate was measured using a quartz resonator. The thickness described below was also measured using the quartz resonator.

(Hole-Injecting Layer)

Copper phthalocyanine: 10 nm thick (deposition rate: 0.5 nm/sec)

(Hole Transport Layer)

α-NPD: 30 nm thick (deposition rate: 0.3 nm/sec)

(Hole Transportable Buffer Layer)

CBP and phosphorescent dopant EM-1 were co-deposited in vacuum with a deposition rate of CBP of 0.3 nm/sec so that EM-1 accounts for 8% by mass of the total amount of the organic material in the buffer layer. The thickness of the buffer layer was 10 nm.

(Luminescent Layer)

Three components of CBP (hole transportable host), ETM-1 (electron transportable host) and phosphorescent dopant (EM-1) were co-deposited so that EM-1 accounts for 8% by mass in the entire organic material with deposition rates of CBP and ETM-1 of 0.3 nm/sec, respectively. The thickness of the luminescent layer was 20 nm.

(Electron Transportable Buffer Layer)

ETM-1 and phosphorescent dopant (EM-1) were co-deposited so that EM-1 accounts for 8% by mass in the entire organic material with deposition rate of ETM-1 of 0.3 nm/sec.

(Electron Transport Layer 1)

BALQ: 10 nm thick (deposition rate: 0.3 nm/sec)

(Electron Transport Layer 2)

Electron transport material ALQ: thick 30 nm thick (deposition rate: 1 nm/sec)

After forming each layer, a patterned mask (a mask having a luminescent region with an area of 2 mm×2 mm) was placed on the layers, and an electron injecting layer was formed by depositing lithium fluoride at a deposition rate of 0.1 nm/sec. Metallic aluminum was further deposited thereon to form a cathode with a thickness of 100 nm.

The laminate prepared as described above was placed in a globe box substituted with argon gas, and the laminate was sealed using a stainless steel sealing can and a UV curable adhesive (trade name XNR 5516HV, manufactured by Nagase-CIBA Ltd.) to prepare the organic EL element in Example 1.

Comparative Example 1

The organic EL element in Comparative Example 1 was prepared by the same way as used in the organic EL element in Example 1, except that, in the organic EL element in Examples 1, α-NPD was deposited at a deposition rate of 0.3 nm/sec at a thickness of 10 nm in place of the hole transportable buffer layer, and BALQ was deposited a deposition rate of 0.3 nm/sec at a thickness of 10 nm in place of the electron transportable buffer layer.

Example 2

The organic EL element in Example 2 was prepared by the same method as used in the organic EL element in Example 1, except that, in the organic EL element in Example 1, deposition conditions of the hole transportable buffer layer and electron transportable buffer layer were changed as follows.

(Hole Transportable Buffer Layer)

Three components of CBP, electron transportable material ETM-1 and phosphorescent dopant EM-1 were co-deposited by fixing the deposition rate of CBP at 0.3 nm/sec and by gradually increasing the deposition rates of ETM-1 and EM-1 so that EM-1 accounts for 8% by mass of the total amount of the organic material in the buffer layer. The thickness of the laminate was adjusted to 10 nm, and the deposition rates were controlled so that proportion of CBP to ETM is 1:1 when the thickness had reached 10 nm.

(Electron Transportable Buffer Layer)

The deposition rates of CBP and ETM-1 were adjusted to 0.3 nm/sec, respectively, and co-deposition of the three components were started so that EM-1 accounts for 8% by mass of the total amount of the organic material in the buffer layer. The thickness of the laminate was adjusted to 10 nm, and the deposition rate was controlled so that it is zero when the thickness had reached 10 nm.

Comparative Example 2

The organic EL element in Comparative Example 2 was prepared by the same method as in the organic EL element in Example 2, except that, in the organic EL element in Example 2, the deposition conditions of the hole transportable buffer layer and electron transportable buffer layer were changed as follows.

(Hole Transportable Buffer Layer)

The deposition rate of CBP was fixed to 0.3 nm/sec, and the components were co-deposited by gradually increasing the deposition rate of ETM-1. EM-1 was not deposited. The thickness of the laminate was 10 nm, and the deposition rate was controlled so that the proportion of CBP to ETM is 1:1 when the thickness had reached 10 nm.

(Electron Transportable Buffer Layer)

The deposition rates of CBP and ETM-1 were adjusted to 0.3 nm/sec, respectively, to start co-deposition. The thickness of the laminate was adjusted to 10 nm, and the deposition rate was gradually decreased so that the deposition rate of CBP was zero when the thickness had reached 10 nm. EM-1 was not deposited.

Examples 3 and 4

The organic EL elements as those in Examples 3 and 4 were prepared by the same method as the organic EL elements in Examples 1 and 2 and Comparative Examples 1 and 2, except that, in the organic EL elements in Examples 1 and 2, luminescent dopant EM-2 was used in place of EM-1 used for the luminescent layer and buffer layer.

Comparative Examples 3 and 4

The organic EL elements in Comparative Examples 3 and 4 were prepared by the same method as in Comparative Examples 1 and 2, except that, in the organic EL elements in Comparative Examples 1 and 2, luminescent dopant EM-2 was used in place of EM-1 used for the luminescent layer.

Examples 5 and 6

Organic EL elements as those in Examples 5 and 6 were prepared by the same method as in the organic EL elements in Examples 1 and 2, except that, in the organic EL elements in Examples 1 and 2, MCP and EM-3 were used in place of CBP and EM-1 used in the luminescent layer and buffer layer, respectively.

Comparative Examples 5 and 6

An organic EL element as that in Comparative Examples 5 was prepared by the same method as in Comparative Example 1, except that, in the organic EL element in Comparative Example 1, MCP and EM-3 were used in place of CBP and EM-1, respectively, used in the luminescent layer.

An organic EL element as that in Comparative Examples 6 was prepared by the same method as in Comparative Example 2, except that, in the organic EL element in Comparative Example 2, MCP and EM-3 were used in place of CBP and EM-1, respectively, used in the buffer layer, respectively.

Examples 7 and 8

Organic EL elements as those in Example 7 and 8 were prepared by the same method as in Examples 1 and 2, except that, in the organic EL elements in Examples 1 and 2, MCP and luminescent dopant EM-4 were used in place of CBP and EM-1, respectively, used for the luminescent layer and buffer layer, respectively.

Comparative Examples 7 and 8

An organic EL element as that in Comparative Example 7 was prepared by the same method as in Comparative Example 1, except that, in the organic EL element in Comparative Example 1, MCP and EM-4 were used in place of CBP and EM-1, respectively, used for the luminescent layer.

An organic EL element as that in Comparative Example 8 was prepared by the same method as in Comparative Example 2, except that, in the organic EL element in Comparative Example 2, MCP and EM-4 were used in place of CBP and EM-1, respectively, used for the luminescent layer.

Examples 9 to 10

Except for the changes made to the hole injecting layer as below, Examples 9 to 10 were made in the same way as the organic EL elements of Examples 7 and 8.

(Hole-Injecting Layer)

Vacuum deposition of Compound H10 was carried out at a rate of 0.5 nm/second together with vacuum deposition of tetrafluorotetracyano-quinodimethane such that the amount of tetrafluorotetracyano-quinodimethane becomes 0.3% by mass of the total organic material of the hole-injecting layer. The film thickness of the film of the hole-injecting layer was made 160 nm.

Comparative Examples 9 to 10

Except for the changes made to the hole injecting layer as below, Comparative Examples 9 to 10 were made in the same way as the organic EL elements of Comparative Examples 7 and 8.

(Hole-Injecting Layer)

Vacuum deposition of Compound H10 was carried out at a rate of 0.5 nm/second together with vacuum deposition of tetrafluorotetracyano-quinodimethane such that the amount of tetrafluorotetracyano-quinodimethane becomes 0.3% by mass of the total organic material of the hole-injecting layer. The film thickness of the film of the hole-injecting layer was made 160 nm.

The results are shown in Table 3.

TABLE 3

|  | Driving Voltage (V) | External Quantum efficiency (%) | Half Decay Period of Luminance (Hour) |
| --- | --- | --- | --- |
| Example 9 | 5.2 | 7.3 | 2800 |
| Example 10 | 5.1 | 7.0 | 2300 |
| Comparative Example 9 | 9.0 | 4.5 | 960 |
| Comparative Example 10 | 8.7 | 3.6 | 890 |

The results in Table 3 show that, even in an element with a hole-injecting layer including tetrafluorotetracyano-quinodimethane as an electron acceptor dopant, the organic EL elements of the invention have a low driving voltage, show high luminous efficiency and have excellent running durability when compared to the Comparative Examples.

Examples 11 to 12

Except for the changes made to the electron transport layer 2 as below, Examples 11 to 12 were made in the same way as the organic EL elements of Examples 7 and 8.

(Electron Transport Layer 2)

Vacuum deposition was carried out with electron transport material ALQ: vacuum deposition rate 0.2 nm/s; Lithium: combined deposition so as to be 1.5% by mass of the total material of the electron transport layer 2. The film thickness of the electron transport layer 2 was made 40 nm.

Comparative Examples 11 to 12

Except for the changes made to the electron transport layer 2 as below, Comparative Examples 11 to 12 were made in the same way as the organic EL elements of Comparative Examples 7 and 8.

(Electron Transport Layer 2)

Vacuum deposition was carried out with electron transport material ALQ: vacuum deposition rate 0.2 nm/s; Lithium: combined deposition so as to be 1.5% by mass of the total material of the electron transport layer 2. The film thickness of the electron transport layer 2 was made 40 nm.

The results are shown in Table 4.

TABLE 4

|  | Driving Voltage (V) | External Quantum efficiency (%) | Half Decay Period of Luminance (Hour) |
| --- | --- | --- | --- |
| Example 11 | 5.6 | 7.4 | 2700 |
| Example 12 | 5.2 | 6.9 | 2200 |
| Comparative Example 11 | 9.2 | 4.4 | 940 |
| Comparative Example 12 | 8.6 | 3.5 | 860 |

The results in Table 4 show that, even in an element with an electron transport layer 2 including lithium as an electron donor dopant, the organic EL elements of the invention have a low driving voltage, show high luminous efficiency and have excellent running durability when compared to the Comparative Examples.

Examples 13 to 14

Except for the changes made to the hole injecting layer and electron transport layer 2 as below, Examples 13 to 14 were made in the same way as the organic EL elements of Examples 7 and 8.

(Hole-Injecting Layer)

Vacuum deposition of Compound H10 was carried out at a rate of 0.5 nm/second together with vacuum deposition of tetrafluorotetracyano-quinodimethane such that the amount of tetrafluorotetracyano-quinodimethane becomes 0.3% by mass of the total organic material of the hole-injecting layer. The film thickness of the film of the hole-injecting layer was made 160 nm.

(Electron Transport Layer 2)

Vacuum deposition was carried out with electron transport material ALQ: vacuum deposition rate 0.2 nm/s; Lithium: combined deposition so as to be 1.5% by mass of the total material of the electron transport layer 2. The film thickness of the electron transport layer 2 was made 40 nm.

Comparative Examples 13 to 14

Except for the changes made to the hole injecting layer and electron transport layer 2 as below, Comparative Examples 13 to 14 were made in the same way as the organic EL elements of Comparative Examples 7 and 8.

(Hole-Injecting Layer)

Vacuum deposition of Compound H10 was carried out at a rate of 0.5 nm/second together with vacuum deposition of tetrafluorotetracyano-quinodimethane such that the amount of tetrafluorotetracyano-quinodimethane becomes 0.3% by mass of the total organic material of the hole-injecting layer. The film thickness of the film of the hole-injecting layer was made 160 nm.

(Electron Transport Layer 2)

Vacuum deposition was carried out with electron transport material ALQ: vacuum deposition rate 0.2 nm/s; Lithium: combined deposition so as to be 1.5% by mass of the total material of the electron transport layer 2. The film thickness of the electron transport layer 2 was made 40 nm.

The results are shown in Table 5.

TABLE 5

| | Driving Voltage (V) | External Quantum efficiency (%) | Half Decay Period of Luminance (Hour) |
|---|---|---|---|
| Example 13 | 4.7 | 7.6 | 2900 |
| Example 14 | 4.3 | 7.2 | 2400 |
| Comparative Example 13 | 8.3 | 4.3 | 960 |
| Comparative Example 14 | 7.7 | 3.3 | 900 |

The results in Table 5 show that, even in an element with a hole-injecting layer including tetrafluorotetracyano-quinodimethane as an electron acceptor dopant, and an electron transport layer 2 including lithium as an electron donor dopant, the organic EL elements of the invention have a low driving voltage, show high luminous efficiency and have excellent running durability when compared to the Comparative Examples.

The structures of the compounds used for respective organic EL elements above are shown below.

α-NPD

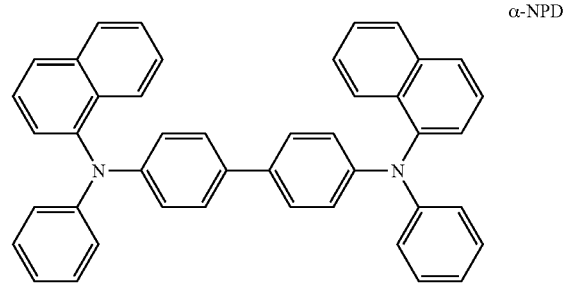

CBP

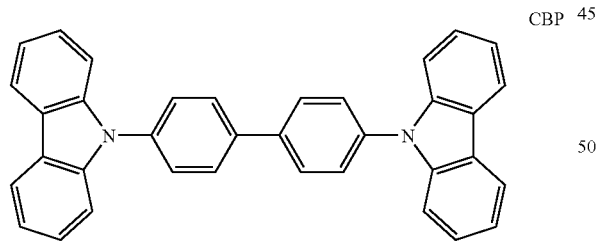

MCP

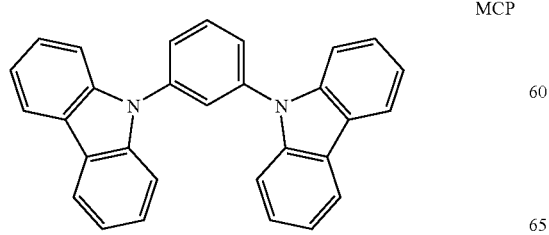

-continued

ETM-1

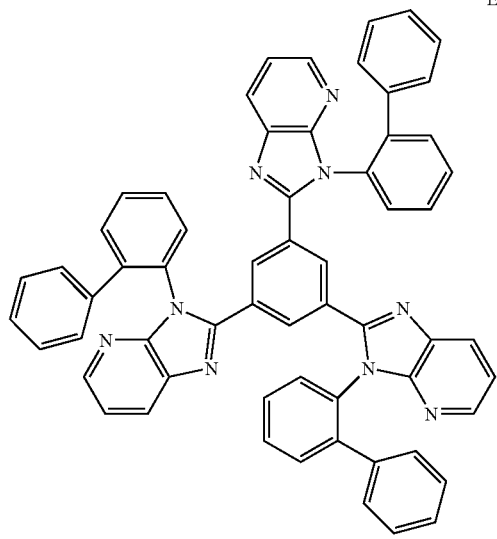

EM-1

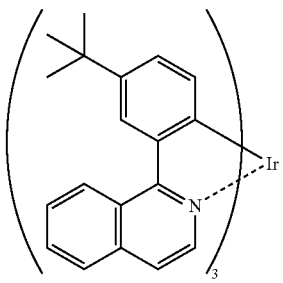

EM-2

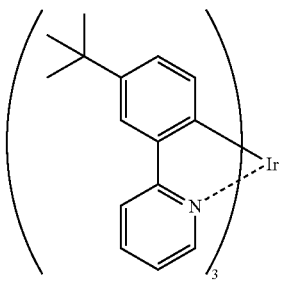

EM-3

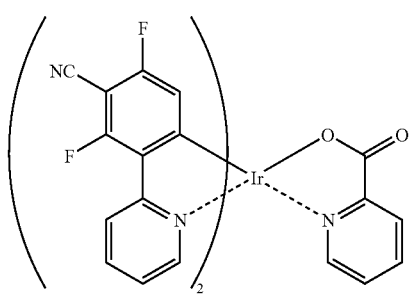

-continued

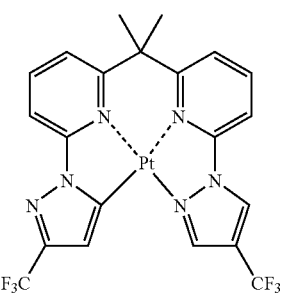

EM-4

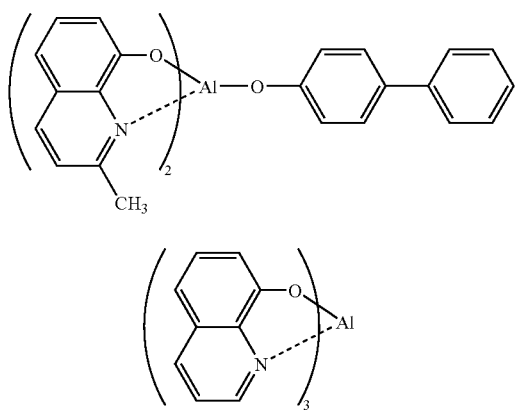

BAlq

Alq

2. Evaluation of Physical Properties of the Compound

The methods for measuring the ionization potential, electron affinity and $T_1$ energy of each compound used in the examples and comparative examples are shown in Table 6.

(1) Ionization Potential

Each compound used for the organic compound layer was deposited on a glass substrate at a thickness of 50 nm. The ionization potential of this film was measured under an atmospheric pressure using a UV photoelectron analyzer AC-1 or AC-3 (trade name, manufactured by RIKEN KENKI Co., Ltd.)

(2) Electron Affinity

The UV-visible absorption spectrum of the film used for the measurement of the ionization potential was measured with a spectrophotometer (trade name UV 3100, manufactured by Shimadzu Corporation), and the driving energy was determined from the energy at the long wavelength end of the absorption spectrum. Electron affinity was calculated from the driving energy and ionization potential.

(3) $T_1$ energy

The phosphorescence spectrum of the film used for the measurement of the ionization potential was measured at a temperature of 77K using a phosphorescence driving spectrometer (trade name F4500, manufactured by Hitachi Ltd.), and $T_1$ energy was determined from the energy at the short wavelength end of the phosphorescence spectrum.

TABLE 6

| Name of Compound | Ionization Potential (eV) | Electron Affinity (eV) | $T_1$ Energy (kJ/mol) |
|---|---|---|---|
| CuPc | 5.1 | 3.4 | 230 or less |
| α-NPD | 5.4 | 2.4 | 230 or less |
| CBP | 5.9 | 2.5 | 251 |
| MCP | 5.9 | 2.3 | 278 |
| ETM-1 | 6.6 | 3.0 | 251 |
| EM-1 | 5.3 | 3.0 | 196 |
| EM-2 | 5.3 | 2.6 | 242 |
| EM-3 | 5.9 | 3.0 | 259 |
| EM-4 | 6.1 | 3.2 | 260 |
| BAlq | 5.9 | 2.9 | 226 |
| Alq | 5.8 | 3.0 | 230 or less |

3. Evaluation of Organic EL Element

The organic EL element obtained was evaluated by the following methods.

(1) External Quantum Efficiency

The waveform of the emission spectrum of the luminescent element prepared is measured using a multi-channel analyzer PMA-11 (trade name, manufactured by Hamamatsu Photonics K.K.), and an emission peak is determined from the measured peak. The external quantum efficiency is calculated from the waveform of the emission spectrum, and the electric current and luminance (300 cd/m$^2$) used for the measurement. The results are shown in Table 7.

(2) Driving Durability Test

The luminescent element is allowed to emit a light by applying a DC current using a source-measure unit 2400 (trade name, manufactured by Keithley Instruments Inc.). Luminance of the element is measured with a luminance meter BM-8 (trade name, manufactured by TOPCON CORPORATION), and the external quantum efficiency at 300 cd/m$^2$ is calculated.

Subsequently, the luminescent element is subjected to a continuous driving test under a condition of constant initial luminance, and the time when luminance is decreased to one half of the initial luminance is defined as a half decay period $T(\frac{1}{2})$ of luminance. The results are shown in Table 2. (The elements in Examples 1 to 4 and Comparative Examples 1 to 4 were evaluated with an initial luminance of 2000 cd/m$^2$, while the elements in Examples 5 to 8 and comparative Examples 5 to 8 were evaluated with an initial luminance of 360 cd/m$^2$.)

(3) Driving Voltage

The luminescent element is allowed to emit a light by applying a DC voltage to the element using the source measure unit 2400 (trade name, manufactured by Keithley Instruments Inc.). The voltage when luminance (measured with luminance meter BM-8 (trade name, manufactured by TOPCON CORPORATION)) is decreased to 300 cd/m$^2$ is measured. The results are shown in Table 7.

TABLE 7

| | Driving Voltage (V) | External Quantum efficiency (%) | Half Decay Period of Luminance (Hour) |
|---|---|---|---|
| Example 1 | 5.5 | 10.6 | 4800 |
| Example 2 | 5.0 | 9.5 | 4600 |
| Comparative Example 1 | 7.0 | 6.3 | 2200 |

TABLE 7-continued

|  | Driving Voltage (V) | External Quantum efficiency (%) | Half Decay Period of Luminance (Hour) |
|---|---|---|---|
| Comparative Example 2 | 6.0 | 3.1 | 1800 |
| Example 3 | 5.5 | 15.5 | 3900 |
| Example 4 | 5.0 | 13.3 | 3100 |
| Comparative Example 3 | 7.5 | 8.3 | 1800 |
| Comparative Example 4 | 6.5 | 4.2 | 1200 |
| Example 5 | 7.5 | 8.5 | 2200 |
| Example 6 | 7.0 | 7.0 | 1800 |
| Comparative Example 5 | 9.5 | 5.3 | 1200 |
| Comparative Example 6 | 8.5 | 2.1 | 950 |
| Example 7 | 6.5 | 7.2 | 2500 |
| Example 8 | 6.1 | 6.8 | 2100 |
| Comparative Example 7 | 9.8 | 4.5 | 950 |
| Comparative Example 8 | 9.2 | 3.5 | 870 |

The results in Table 7 show that the organic EL element of the invention driven at a low voltage has high luminous efficiency and is excellent in running durability.

Accordingly, the invention provides an organic electroluminescent element having compatibility between high luminous efficiency and driving durability while the element is able to drive at a low voltage.

The invention also includes the following embodiments.

<1> An organic electroluminescent element comprising a plurality of organic compound layers between a pair of electrodes and comprising at least a luminescent layer and a buffer layer adjacent to the luminescent layer, the luminescent layer comprising at least two host materials and at least one luminescent material, the buffer layer comprising at least one of the host materials and at least one dopant material having a charge trapping function.

<2> An organic electroluminescent element according to <1>, wherein the buffer layer contains at least one host material and at least one dopant material having a charge trapping function.

<3> An organic electroluminescent element according to <1>, wherein the buffer layer contains at least a material A and a host material B, the content ratio of the host material A in the buffer layer gradually increasing until the ratio of the host material A to the host material B is at least 1:1 in the direction of thickness of the buffer layer from the electrode side to the luminescent layer side.

<4> An organic electroluminescent element according to any one of through <1> to <3>, wherein the organic compound layer contains a charge transport layer containing a charge transport material and the charge transport material is not contained in the luminescent layer.

<5> An organic electroluminescent element according to any one of through <1> to <4>, wherein the luminescent material is a phosphorescent material.

<6> An organic electroluminescent element according to any one of through <1> to <5>, wherein the dopant is a luminescent material.

All publications, patent applications, and technical standards mentioned in this specification are herein incorporated by reference to the same extent as if such individual publication, patent application, or technical standard was specifically and individually indicated to be incorporated by reference.

It will be obvious to those having skill in the art that many changes may be made in the above-described details of the preferred embodiments of the present invention. The scope of the invention, therefore, should be determined by the following claims.

What is claimed is:

1. An organic electroluminescent element comprising a plurality of organic compound layers between a pair of electrodes and comprising at least a luminescent layer and a buffer layer adjacent to the luminescent layer, wherein:
   the luminescent layer comprises at least two host materials and at least one luminescent material,
   the buffer layer comprises at least one of the host materials and at least one dopant material having a charge trapping function,
   the at least two host materials in the luminescent layer comprise a hole transportable host material and an electron transportable host material, and
   the buffer layer comprises a hole transportable buffer layer that is formed at the anode side of the luminescent layer and an electron transportable buffer layer that is formed at the cathode side of the luminescent layer,
   wherein the hole transportable buffer layer comprises the at least one of the host materials and at least one dopant material having an electron trapping function as the charge trapping function, and the electron transportable buffer layer comprises the at least one of the host materials and at least one dopant material having a hole trapping function as the charge trapping function,
   wherein the at least one dopant material having a hole trapping function has a lower ionization potential than an ionization potential of the at least one of the host materials in the buffer layer, and
   wherein the at least one dopant material having an electron trapping function has a higher electron affinity than an electron affinity of the at least one of the host materials in the buffer layer.

2. The organic electroluminescent element according to claim 1, wherein the plurality of organic compound layers further comprise a charge transport layer containing a charge transport material, and wherein the charge transport material is not contained in the luminescent layer.

3. The organic electroluminescent element according to claim 1, wherein the luminescent material is a phosphorescent material.

4. The organic electroluminescent element according to claim 1, wherein the dopant material having a charge trapping function is a luminescent material.

5. The organic electroluminescent element according to claim 2, wherein the luminescent material is a phosphorescent material.

6. The organic electroluminescent element according to claim 2, wherein the dopant material having a charge trapping function is a luminescent material.

7. The organic electroluminescent element according to claim 3, wherein the dopant material having a charge trapping function is a luminescent material.

8. An organic electroluminescent element comprising a plurality of organic compound layers between a pair of electrodes and comprising at least a luminescent layer and a buffer layer adjacent to the luminescent layer, the luminescent layer comprising at least two host materials and at least one luminescent material, the buffer layer comprising a single host material and a single dopant material having a charge trapping function,
   wherein the at least two host materials in the luminescent layer comprise a hole transportable host material and an electron transportable host material, and the buffer layer comprises a hole transportable buffer layer that is formed at the anode side of the luminescent layer and an electron transportable buffer layer that is formed at the cathode side of the luminescent layer, wherein the hole transportable buffer layer comprises the single host material and a single dopant material having an electron trapping function as the charge trapping function, and the electron transportable buffer layer comprises the single host material and a single dopant material having a hole trapping function as the charge trapping function, wherein the single dopant material having a hole trapping function has a lower ionization potential than an ionization potential of the single host material in the buffer layer, and wherein the single dopant material having an electron trapping function has a higher electron affinity than an electron affinity of the single host material in the buffer layer.

9. The organic electroluminescent element according to claim 8, wherein the plurality of organic compound layers further comprise a charge transport layer containing a charge transport material, and wherein the transport material is not contained in the luminescent layer.

10. The organic electroluminescent element according to claim 8, wherein the luminescent material is a phosphorescent material.

11. The organic electroluminescent element according to claim 8, wherein the dopant material having a charge trapping function is a luminescent material.

12. The organic electroluminescent element according to claim 9, wherein the luminescent material is a phosphorescent material.

13. The organic electroluminescent element according to claim 9, wherein the dopant material having a charge trapping function is a luminescent material.

14. An organic electroluminescent element comprising a plurality of organic compound layers between a pair of electrodes and comprising at least a luminescent layer and a buffer layer adjacent to the luminescent layer, the luminescent layer comprising at least two host materials and at least one luminescent material, the buffer layer comprising at least one of the host materials and at least one dopant material having a charge trapping function, the buffer layer containing at least a material A and a host material B, the content ratio of the host material A in the buffer layer gradually increasing until the ratio of the host material A to the host material B is at least 1:1 in the direction of thickness of the buffer layer from the electrode side to the luminescent layer side, wherein the at least two host materials in the luminescent layer comprise a hole transportable host material and an electron transportable host material, and the buffer layer comprises a hole transportable buffer layer that is formed at the anode side of the luminescent layer and an electron transportable buffer layer that is formed at the cathode side of the luminescent layer, wherein the hole transportable buffer layer comprises the at least one of the host materials and at least one dopant material having an electron trapping function as the charge trapping function, and the electron transportable buffer layer comprises the at least one of the host materials and at least one dopant material having a hole trapping function as the charge trapping function, wherein the at least one dopant material having a hole trapping function has a lower ionization potential than an ionization potential of the at least one of the host materials in the buffer layer, and wherein the at least one dopant material having an electron trapping function has a higher electron affinity than an electron affinity of the at least one of the host materials in the buffer layer.

15. The organic electroluminescent element according to claim 14, wherein the plurality of organic compound layers comprise a charge transport layer containing a charge transport material and wherein the charge transport material is not contained in the luminescent layer.

16. The organic electroluminescent element according to claim 14, wherein the luminescent material is a phosphorescent material.

17. The organic electroluminescent element according to claim 14, wherein the dopant material having charge trapping function is a luminescent material.

18. The organic electroluminescent element according to claim 15, wherein the luminescent material is a phosphorescent material.

19. The organic electroluminescent element according to claim 15, wherein the dopant material having charge trapping function is a luminescent material.

20. The organic electroluminescent element according to claim 16, wherein the dopant material having charge trapping function is a luminescent material.

* * * * *